(12) United States Patent
Kim et al.

(10) Patent No.: US 10,693,506 B2
(45) Date of Patent: Jun. 23, 2020

(54) ELECTRONIC DEVICE COMPRISING ANTENNA

(71) Applicant: Samsung Electronics Co., Ltd., Suwon-si, Gyeonggi-do (KR)

(72) Inventors: Young Ju Kim, Suwon-si (KR); Jong Hyuk Kim, Yongin-si (KR); Sung Chul Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/777,026

(22) PCT Filed: Nov. 16, 2016

(86) PCT No.: PCT/KR2016/013167
§ 371 (c)(1),
(2) Date: May 17, 2018

(87) PCT Pub. No.: WO2017/099383
PCT Pub. Date: Jun. 15, 2017

(65) Prior Publication Data
US 2018/0337697 A1    Nov. 22, 2018

(30) Foreign Application Priority Data

Dec. 10, 2015 (KR) .................. 10-2015-0176037

(51) Int. Cl.
*H04B 17/19* (2015.01)
*H04B 17/24* (2015.01)
(Continued)

(52) U.S. Cl.
CPC ........... *H04B 1/0064* (2013.01); *G01R 29/08* (2013.01); *G01R 29/10* (2013.01); *H01Q 1/24* (2013.01);
(Continued)

(58) Field of Classification Search
CPC .... H04B 1/0064; H04B 17/16; H04B 7/0602; H04B 17/19; H04B 17/14; H04B 17/21;
(Continued)

(56) References Cited

U.S. PATENT DOCUMENTS 5,930,707 A * 7/1999 Vambaris ............... H04B 17/16
379/29.01
6,147,501 A * 11/2000 Chodora ................ G01R 35/00
324/601
(Continued)

FOREIGN PATENT DOCUMENTS

CN         1792041 A      6/2006
CN       101512832 A      8/2009
(Continued)

OTHER PUBLICATIONS

ISA/KR, "International Search Report and Written Opinion of the International Searching Authority," International Application No. PCT/KR2016/013167, dated Feb. 23, 2017, 8 pages.
(Continued)

*Primary Examiner* — Pablo N Tran

(57) ABSTRACT

An electronic device includes a housing, a communication circuit positioned inside the housing, and including a first port for a first frequency band and a second port for a second frequency band, a first antenna positioned inside the housing or forming a part of the housing, a second antenna positioned inside the housing or forming a part of the housing, a test port positioned inside the housing or at least partially exposed through the housing, and a switching circuit configured to selectively connect one or more of the first port or the second port to one or more of the first antenna, the second antenna, or the test port.

19 Claims, 14 Drawing Sheets

(51) Int. Cl.
| | |
|---|---|
| *H04B 1/00* | (2006.01) |
| *H04B 7/06* | (2006.01) |
| *H04B 1/44* | (2006.01) |
| *G01R 29/10* | (2006.01) |
| *H01Q 1/24* | (2006.01) |
| *G01R 29/08* | (2006.01) |
| *H04Q 11/02* | (2006.01) |
| *H04B 17/21* | (2015.01) |
| *H04B 17/11* | (2015.01) |
| *H04B 17/16* | (2015.01) |

(52) U.S. Cl.
CPC ............ *H04B 1/44* (2013.01); *H04B 7/0602* (2013.01); *H04B 17/11* (2015.01); *H04B 17/16* (2015.01); *H04B 17/21* (2015.01); *H04Q 11/02* (2013.01)

(58) Field of Classification Search
CPC ... H04B 1/38; H04B 1/40; H04B 1/00; H04B 1/04; H04B 1/18; H04B 1/10; H01Q 21/24; H01Q 1/246; H01Q 3/267; H01Q 1/24; H01Q 3/26; H01Q 9/04
See application file for complete search history.

(56) References Cited

U.S. PATENT DOCUMENTS

| | | | |
|---|---|---|---|
| 6,249,227 B1 | 6/2001 | Brady et al. | |
| 6,252,542 B1* | 6/2001 | Sikina | H01Q 3/267 342/174 |
| 6,310,579 B1* | 10/2001 | Meredith | G01R 27/06 324/601 |
| 6,417,674 B1* | 7/2002 | Rowell, Jr. | G01R 35/005 324/601 |
| 7,076,213 B2* | 7/2006 | Lee | H04B 17/0085 324/642 |
| 7,511,681 B2 | 3/2009 | Bolin | |
| 7,671,804 B2 | 3/2010 | Zhang et al. | |
| 7,848,745 B2* | 12/2010 | Hasegawa | H04W 24/06 370/328 |
| 7,907,908 B2* | 3/2011 | Saitou | H04W 24/06 455/129 |
| 7,953,406 B2* | 5/2011 | Itamiya | H04W 24/00 370/338 |
| 8,154,460 B2 | 4/2012 | Sakata et al. | |
| 8,472,881 B2* | 6/2013 | Scheucher | H04B 17/309 455/67.11 |
| 8,983,394 B2* | 3/2015 | Deforge | H04B 17/0085 455/67.11 |
| 10,009,058 B2 | 6/2018 | Khlat | |
| 10,067,171 B2* | 9/2018 | O'Keeffe | G01R 29/10 |
| 10,128,894 B1* | 11/2018 | O'Brien | H04B 17/14 |
| 10,250,290 B2 | 4/2019 | Khlat | |
| 10,298,288 B2 | 5/2019 | Khlat | |
| 2003/0134594 A1* | 7/2003 | Lane | H04B 7/18515 455/12.1 |
| 2010/0081407 A1* | 4/2010 | Adler | H04B 1/006 455/307 |
| 2012/0112970 A1 | 5/2012 | Caballero et al. | |
| 2013/0154761 A1 | 6/2013 | Ilkov | |
| 2013/0260844 A1* | 10/2013 | Rucki | H01Q 1/246 455/575.7 |
| 2013/0337754 A1* | 12/2013 | Khlat | H01P 1/15 455/78 |
| 2014/0328220 A1 | 11/2014 | Khlat et al. | |
| 2015/0200463 A1 | 7/2015 | Heikura et al. | |
| 2015/0230009 A1 | 8/2015 | Choi et al. | |
| 2016/0254870 A1* | 9/2016 | O'Keeffe | H01Q 21/24 455/67.14 |
| 2017/0115334 A1* | 4/2017 | Symes | H04B 17/102 |

FOREIGN PATENT DOCUMENTS

| | | |
|---|---|---|
| CN | 101630773 A | 1/2010 |
| JP | 2002281132 A | 9/2002 |
| JP | 2008537197 A | 9/2008 |
| JP | 2014138192 A | 7/2014 |
| KR | 10-1997-0028568 A | 6/1997 |
| KR | 10-2004-0020669 A | 3/2004 |
| KR | 10-2013-0069444 A | 6/2013 |
| KR | 10-2013-0112895 A | 10/2013 |
| KR | 10-2015-0077657 A | 7/2015 |
| WO | 2006089280 A2 | 8/2006 |

OTHER PUBLICATIONS

European Patent Office, "Supplementary European Search Report," Application No. EP 16873249.3, dated Sep. 26, 2018, 9 pages.
Communication pursuant to Article 94(3) EPC dated Feb. 19, 2019 in connection with European Patent Application No. 16 873 249.3, 5 pages.
First Office Action in connection with Chinese Application No. 201680070612.5 dated Mar. 27, 2020, 35 pages.

* cited by examiner

ELECTRONIC DEVICE COMPRISING ANTENNA

CROSS-REFERENCE TO RELATED APPLICATIONS AND CLAIM OF PRIORITY

This application is a 371 of International Application No. PCT/KR2016/013167, filed Nov. 16, 2016, which claims priority to Korean Patent Application No. KR 10-2015-0176037, filed Dec. 10, 2015, the disclosures of which are incorporated herein by reference in their entirety.

TECHNICAL FIELD

The present disclosure relates to a structure of a circuit for testing a communication circuit connected to an antenna.

BACKGROUND

With developments of information and communication technology, network devices such as a base station and the like have recently installed throughout the country. An electronic device transmits and receives data to and from another electronic device over a network, and thus a user utilizes the network freely anywhere in the country.

An antenna is needed to use the network. In the manufacture of an electronic device including an antenna, an operation of testing the performance of the antenna and/or a communication circuit (e.g., radio frequency (RF) circuit) may be required.

SUMMARY

An RF test switch positioned between the antenna and the communication circuit may be generally used to test the performance of an antenna and a communication circuit. The RF test switch may be expensive and bulky. For the purpose of connecting to a test device through the RF test switch, at least one opening may be formed in the housing of an electronic device. The electronic device including a plurality of antennas may include a plurality of RF test switches for the plurality of antennas, respectively.

To solve the above-mentioned problems and tasks issued in this disclosure, embodiments disclosed in the present disclosure may provide an electronic device and a method that are capable of testing a communication circuit and/or an antenna by using one test port.

According to various embodiments of the present disclosure, an electronic device may include a housing, a communication circuit positioned inside the housing, and including a first port for a first frequency band and a second port for a second frequency band, a first antenna positioned inside the housing or forming a part of the housing, a second antenna positioned inside the housing or forming a part of the housing, a test port positioned inside the housing or at least partially exposed through the housing, and a switching circuit configured to selectively connect one or more of the first port or the second port to one or more of the first antenna, the second antenna, or the test port.

According to various embodiments of the present disclosure, an electronic device may include a communication circuit including a first antenna, a second antenna, a first circuit supporting the communication of a first frequency band, and a second circuit supporting the communication of a second frequency band, a test port connected to test equipment testing a first circuit, a second circuit, a first antenna, and a second antenna, and a plurality of switches. The electronic device may include a switching circuit connecting one of the first circuit, the second circuit, the first antenna, the second antenna, and the test port to another of the first circuit, the second circuit, the first antenna, the second antenna, and the test port.

Other aspects, advantages, and salient features of the disclosure will become apparent to those skilled in the art from the following detailed description, which, taken in conjunction with the annexed drawings, discloses various embodiments of the present disclosure.

According to various embodiments of the present disclosure, a test port may be selectively connected to a low band (LB) RF circuit, a middle band (MB) RF circuit, or a high band (HB) RF circuit by using a relatively small-size switching circuit, thereby securing the space of the housing.

According to another embodiment of the present disclosure, a test port may be selectively connected to a first antenna or a second antenna by using a switching circuit for the purpose of testing an antenna as well as an RF circuit by using a test port.

According to still another embodiment of the present disclosure, an antenna and an RF circuit may be selectively connected to each other by using a switching circuit, and thus, the antenna and the RF circuit supporting the required band may be activated.

According to yet another embodiment of the present disclosure, the antenna and a load or a ground part may be connected to each other by using the switching circuit, and thus the resonance frequency of the antenna may be changed and the communication performance of the antenna may be improved.

Besides, a variety of effects directly or indirectly understood through this disclosure may be provided.

DETAILED DESCRIPTION

Figure 1:
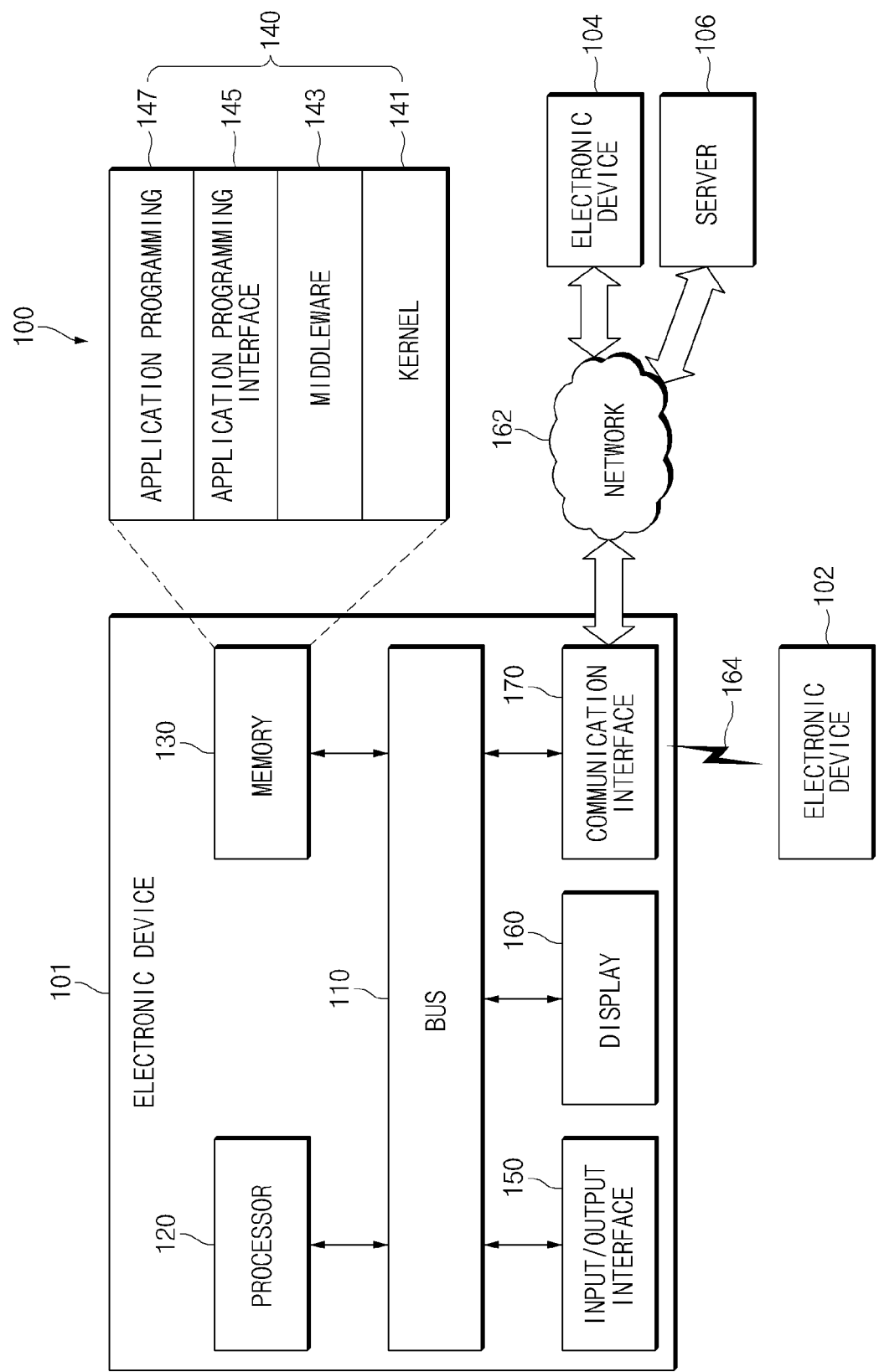
FIG. 1 illustrates an electronic device in a network environment according to various embodiments.

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar elements may be marked by similar reference numerals.

In this disclosure, the expressions "have", "may have", "include" and "comprise", or "may include" and "may comprise" used herein indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used in this disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this disclosure are used to describe specified embodiments and are not intended to limit the scope of the present disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this disclosure. In some cases, even if terms are terms which are defined in this disclosure, they may not be interpreted to exclude embodiments of this disclosure.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of this disclosure may not be limited to the above-described electronic devices and may include other electronic devices and new electronic devices according to the development of technologies.

Hereinafter, electronic devices according to various embodiments will be described with reference to the accompanying drawings. In this disclosure, the term "user" may refer to a person who uses an electronic device or may refer to a device (e.g., an artificial intelligence electronic device) that uses the electronic device.

FIG. 1 illustrates an electronic device in a network environment system, according to various embodiments.

Referring to FIG. 1, according to various embodiments, an electronic device 101, 102, or 104, or a server 106 may be connected each other over a network 162 or a short range communication 164. The electronic device 101 may include a bus 110, a processor 120, a memory 130, an input/output interface 150, a display 160, and a communication interface 170. According to an embodiment, the electronic device 101 may not include at least one of the above-described elements or may further include other element(s).

According to various embodiments of the present disclosure, for example, the bus 110 may interconnect the above-described elements 110 to 170 and may include a circuit for conveying communications (e.g., a control message and/or data) among the above-described elements.

According to various embodiments of the present disclosure, the processor 120 may include one or more of a central processing unit (CPU), an application processor (AP), or a communication processor (CP). For example, the processor 120 may perform an arithmetic operation or data processing associated with control and/or communication of at least other elements of the electronic device 101.

According to various embodiments of the present disclosure, the memory 130 may include a volatile and/or nonvolatile memory. For example, the memory 130 may store instructions or data associated with at least one other element(s) of the electronic device 101. According to an embodiment, the memory 130 may store software and/or a program 140. The program 140 may include, for example, a kernel 141, a middleware 143, an application programming interface (API) 145, and/or an application program (or "an application") 147. At least a part of the kernel 141, the middleware 143, or the API 145 may be referred to as an "operating system (OS)".

According to various embodiments of the present disclosure, for example, the kernel 141 may control or manage system resources (e.g., the bus 110, the processor 120, the memory 130, and the like) that are used to execute operations or functions of other programs (e.g., the middleware 143, the API 145, and the application program 147). According to another embodiment, the kernel 141 may provide an interface that allows the middleware 143, the API 145, or the application program 147 to access discrete elements of the electronic device 101 so as to control or manage system resources.

According to various embodiments of the present disclosure, the middleware 143 may perform, for example, a mediation role such that the API 145 or the application program 147 communicates with the kernel 141 to exchange data.

According to various embodiments of the present disclosure, the middleware 143 may process task requests received from the application program 147 according to a priority. For example, the middleware 143 may assign the priority, which makes it possible to use a system resource (e.g., the bus 110, the processor 120, the memory 130, or the like) of the electronic device 101, to at least one of the application program 147. For example, the middleware 143 may process the one or more task requests according to the priority assigned to the at least one, which makes it possible to perform scheduling or load balancing on the one or more task requests.

According to various embodiments of the present disclosure, the API 145 may be, for example, an interface through which the application program 147 controls a function provided by the kernel 141 or the middleware 143, and may include, for example, at least one interface or function (e.g., an instruction) for a file control, a window control, image processing, a character control, or the like.

According to various embodiments of the present disclosure, the input/output interface 150 may play a role, for example, of an interface which transmits an instruction or data input from a user or another external device, to other element(s) of the electronic device 101. According to another embodiment, the input/output interface 150 may output an instruction or data, received from other element(s) of the electronic device 101, to a user or another external device.

According to various embodiments of the present disclosure, the display 160 may include, for example, a liquid crystal display (LCD), a light-emitting diode (LED) display, an organic LED (OLED) display, a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, gesture, proximity, or hovering input using an electronic pen or a part of a user's body.

According to various embodiments of the present disclosure, for example, the communication interface 170 may establish communication between the electronic device 101 and an external device (e.g., the first electronic device 102, the second electronic device 104, or the server 106). For example, the communication interface 170 may be connected to the network 162 over wireless communication or wired communication to communicate with the external device (e.g., the second electronic device 104 or the server 106).

According to various embodiments of the present disclosure, the wireless communication may use at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. According to another embodiment, the wireless communication may include, for example, the short range communication 164. The short range communication 164 may include at least one of wireless fidelity (Wi-Fi), Bluetooth, near field communication (NFC), magnetic stripe transmission (MST), a global navigation satellite system (GNSS), or the like.

According to various embodiments of the present disclosure, the MST may generate a pulse in response to transmission data using an electromagnetic signal, and the pulse may generate a magnetic field signal. The electronic device 101 may transfer the magnetic field signal to point of sale (POS), and the POS may detect the magnetic field signal using a MST reader. The POS may recover the data by converting the detected magnetic field signal to an electrical signal.

According to various embodiments of the present disclosure, the GNSS may include at least one of, for example, a global positioning system (GPS), a global navigation satellite system (Glonass), a Beidou navigation satellite system (hereinafter referred to as "Beidou"), or an European global satellite-based navigation system (hereinafter referred to as "Galileo") based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 162 may include at least one of telecommunications networks, for example, a computer network (e.g., LAN or WAN), an Internet, or a telephone network.

According to various embodiments of the present disclosure, each of the first and second external electronic devices 102 and 104 may be a device of which the type is different from or the same as that of the electronic device 101. According to an embodiment, the server 106 may include a group of one or more servers. According to various embodiments, all or a portion of operations that the electronic device 101 will perform may be executed by another or plural electronic devices (e.g., the electronic device 102 or 104 or the server 106). According to an embodiment, in the case where the electronic device 101 executes any function or service automatically or in response to a request, the electronic device 101 may not perform the function or the service internally, but, alternatively additionally, it may request at least a portion of a function associated with the electronic device 101 from another device (e.g., the electronic device 102 or 104 or the server 106). The other electronic device (e.g., the electronic device 102 or 104 or the server 106) may execute the requested function or additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figure 2:
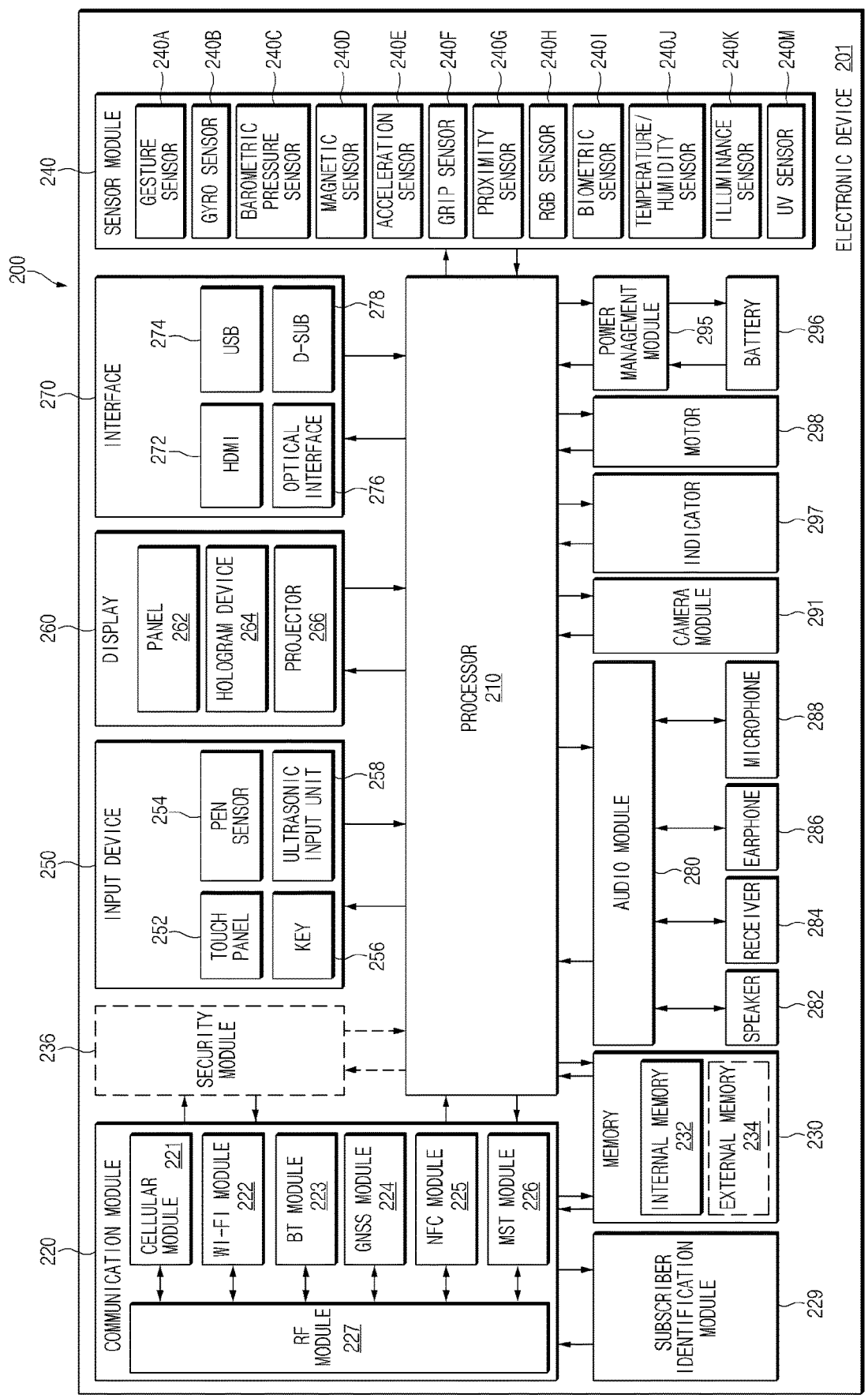
FIG. 2 illustrates a block diagram of the electronic device, according to various embodiments.

FIG. 2 illustrates a block diagram of an electronic device, according to various embodiments.

Referring to FIG. 2, an electronic device 201 may include, for example, all or a part of the electronic device 101 illustrated in FIG. 1. The electronic device 201 may include one or more processors (e.g., an application processor (AP)) 210, a communication module 220, a subscriber identification module 229, a memory 230, a sensor module 240, an input device 250, a display 260, an interface 270, an audio module 280, a camera module 291, a power management module 295, a battery 296, an indicator 297, and a motor 298.

According to various embodiments of the present disclosure, the processor 210 may drive, for example, an operating system (OS) or an application to control a plurality of hardware or software elements connected to the processor 210 and may process and compute a variety of data. For example, the processor 210 may be implemented with a System on Chip (SoC). According to an embodiment, the processor 210 may further include a graphic processing unit (GPU) and/or an image signal processor. The processor 210 may include at least a part (e.g., a cellular module 221) of elements illustrated in FIG. 2. The processor 210 may load a command or data, which is received from at least one of other elements (e.g., a nonvolatile memory), into a volatile memory and process the loaded command or data. The processor 210 may store a variety of data in the nonvolatile memory.

According to various embodiments of the present disclosure, the communication module 220 may be configured the same as or similar to the communication interface 170 of FIG. 1. The communication module 220 may include the cellular module 221, a Wi-Fi module 222, a Bluetooth (BT) module 223, a GNSS module 224 (e.g., a GPS module, a Glonass module, a Beidou module, or a Galileo module), a near field communication (NFC) module 225, a MST module 226 and a radio frequency (RF) module 227.

According to various embodiments of the present disclosure, the cellular module 221 may provide, for example, voice communication, video communication, a character service, an Internet service, or the like over a communication network. According to an embodiment, the cellular module 221 may perform discrimination and authentication of the electronic device 201 within a communication network by using the subscriber identification module (e.g., a SIM card) 229. According to an embodiment, the cellular module 221 may perform at least a portion of functions that the processor 210 provides. According to an embodiment, the cellular module 221 may include a communication processor (CP).

According to various embodiments of the present disclosure, each of the Wi-Fi module 222, the BT module 223, the GNSS module 224, the NFC module 225, or the MST module 226 may include a processor for processing data exchanged through a corresponding module, for example. According to an embodiment, at least a part (e.g., two or more) of the cellular module 221, the Wi-Fi module 222, the BT module 223, the GNSS module 224, the NFC module 225, or the MST module 226 may be included within one Integrated Circuit (IC) or an IC package.

According to various embodiments of the present disclosure, for example, the RF module 227 may transmit and receive a communication signal (e.g., an RF signal). For example, the RF module 227 may include a transceiver, a power amplifier module (PAM), a frequency filter, a low noise amplifier (LNA), an antenna, or the like. According to another embodiment, at least one of the cellular module 221, the Wi-Fi module 222, the BT module 223, the GNSS module 224, the NFC module 225, or the MST module 226 may transmit and receive an RF signal through a separate RF module.

According to various embodiments of the present disclosure, the subscriber identification module 229 may include, for example, a card and/or embedded SIM that includes a subscriber identification module and may include unique identify information (e.g., integrated circuit card identifier (ICCID)) or subscriber information (e.g., integrated mobile subscriber identity (IMSI)).

According to various embodiments of the present disclosure, the memory 230 (e.g., the memory 130) may include an internal memory 232 or an external memory 234. For example, the internal memory 232 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

According to various embodiments of the present disclosure, the external memory 234 may further include a flash drive such as compact flash (CF), secure digital (SD), micro secure digital (Micro-SD), mini secure digital (Mini-SD), extreme digital (xD), a multimedia card (MMC), a memory stick, or the like. The external memory 234 may be operatively and/or physically connected to the electronic device 201 through various interfaces.

According to various embodiments of the present disclosure, a security module 236 may be a module that includes a storage space of which a security level is higher than that of the memory 230 and may be a circuit that guarantees safe data storage and a protected execution environment. The security module 236 may be implemented with a separate circuit and may include a separate processor. For example, the security module 236 may be in a smart chip or a secure digital (SD) card, which is removable, or may include an embedded secure element (eSE) embedded in a fixed chip of the electronic device 201. According to another embodiment, the security module 236 may operate based on an operating system (OS) that is different from the OS of the electronic device 201. For example, the security module 236 may operate based on java card open platform (JCOP) OS.

According to various embodiments of the present disclosure, the sensor module 240 may measure, for example, a physical quantity or may detect an operation state of the electronic device 201. The sensor module 240 may convert the measured or detected information to an electric signal. For example, the sensor module 240 may include at least one of a gesture sensor 240A, a gyro sensor 240B, a barometric pressure sensor 240C, a magnetic sensor 240D, an acceleration sensor 240E, a grip sensor 240F, the proximity sensor 240G, a color sensor 240H (e.g., red, green, blue (RGB) sensor), a biometric sensor 240I, a temperature/humidity sensor 240J, an illuminance sensor 240K, or an UV sensor 240M. Although not illustrated, additionally or generally, the sensor module 240 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one or more sensors included therein. According to an embodiment, the electronic device 201 may further include a processor that is a part of the processor 210 or independent of the processor 210 and is configured to control the sensor module 240. The processor may control the sensor module 240 while the processor 210 remains at a sleep state.

According to various embodiments of the present disclosure, the input device 250 may include, for example, a touch panel 252, a (digital) pen sensor 254, a key 256, or an ultrasonic input unit 258. For example, the touch panel 252 may use at least one of capacitive, resistive, infrared and ultrasonic detecting methods. According to another embodiment, the touch panel 252 may further include a control circuit. The touch panel 252 may further include a tactile layer to provide a tactile reaction to a user.

According to various embodiments of the present disclosure, the (digital) pen sensor 254 may be, for example, a part of a touch panel or may include an additional sheet for recognition. The key 256 may include, for example, a physical button, an optical key, a keypad, or the like. The ultrasonic input device 258 may detect (or sense) an ultrasonic signal, which is generated from an input device, through a microphone (e.g., a microphone 288) and may check data corresponding to the detected ultrasonic signal.

According to various embodiments of the present disclosure, the display 260 (e.g., the display 160) may include a panel 262, a hologram device 264, or a projector 266. The panel 262 may be the same as or similar to the display 160 illustrated in FIG. 1. The panel 262 may be implemented, for example, to be flexible, transparent or wearable. The panel 262 and the touch panel 252 may be integrated into a single module. The hologram device 264 may display a stereoscopic image in a space using a light interference phenomenon. The projector 266 may project light onto a screen so as to display an image. For example, the screen may be arranged in the inside or the outside of the electronic device 201. According to an embodiment, the display 260 may further include a control circuit for controlling the panel 262, the hologram device 264, or the projector 266.

According to various embodiments of the present disclosure, the interface 270 may include, for example, a high-definition multimedia interface (HDMI) 272, a universal serial bus (USB) 274, an optical interface 276, or a D-subminiature (D-sub) 278. The interface 270 may be included, for example, in the communication interface 170 illustrated in FIG. 1. Additionally or generally, the interface 270 may include, for example, a mobile high definition link (MHL) interface, a SD card/multi-media card (MMC) interface, or an infrared data association (IrDA) standard interface.

According to various embodiments of the present disclosure, the audio module 280 may convert a sound and an electric signal in dual directions. At least a part of the audio module 280 may be included, for example, in the input/output interface 150 illustrated in FIG. 1. The audio module 280 may process, for example, sound information that is input or output through a speaker 282, a receiver 284, an earphone 286, or the microphone 288.

According to various embodiments of the present disclosure, for example, the camera module 291 may shoot a still image or a video. According to an embodiment, the camera module 291 may include at least one or more image sensors (e.g., a front sensor or a rear sensor), a lens, an image signal processor (ISP), or a flash (e.g., an LED or a xenon lamp).

According to various embodiments of the present disclosure, the power management module 295 may manage, for example, power of the electronic device 201. According to an embodiment, a power management integrated circuit (PMIC), a charger IC, or a battery or fuel gauge may be included in the power management module 295. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 296 and a voltage, current or temperature thereof while the battery is charged. The battery 296 may include, for example, a rechargeable battery and/or a solar battery.

According to various embodiments of the present disclosure, the indicator 297 may display a specific state of the electronic device 201 or a part thereof (e.g., the processor 210), such as a booting state, a message state, a charging state, and the like. The motor 298 may convert an electrical signal into a mechanical vibration and may generate the following effects: vibration, haptic, and the like. Although not illustrated, a processing device (e.g., a GPU) for supporting a mobile TV may be included in the electronic device 201. The processing device for supporting the mobile TV may process media data according to the standards of digital multimedia broadcasting (DMB), digital video broadcasting (DVB), MediaFlo™, or the like.

Each of the above-mentioned elements of the electronic device according to various embodiments of the present disclosure may be configured with one or more components, and the names of the elements may be changed according to the type of the electronic device. In various embodiments, the electronic device may include at least one of the above-mentioned elements, and some elements may be omitted or other additional elements may be added. According to another embodiment, some of the elements of the electronic device according to various embodiments may be combined with each other so as to form one entity, so that the functions of the elements may be performed in the same manner as before the combination.

Figure 3:
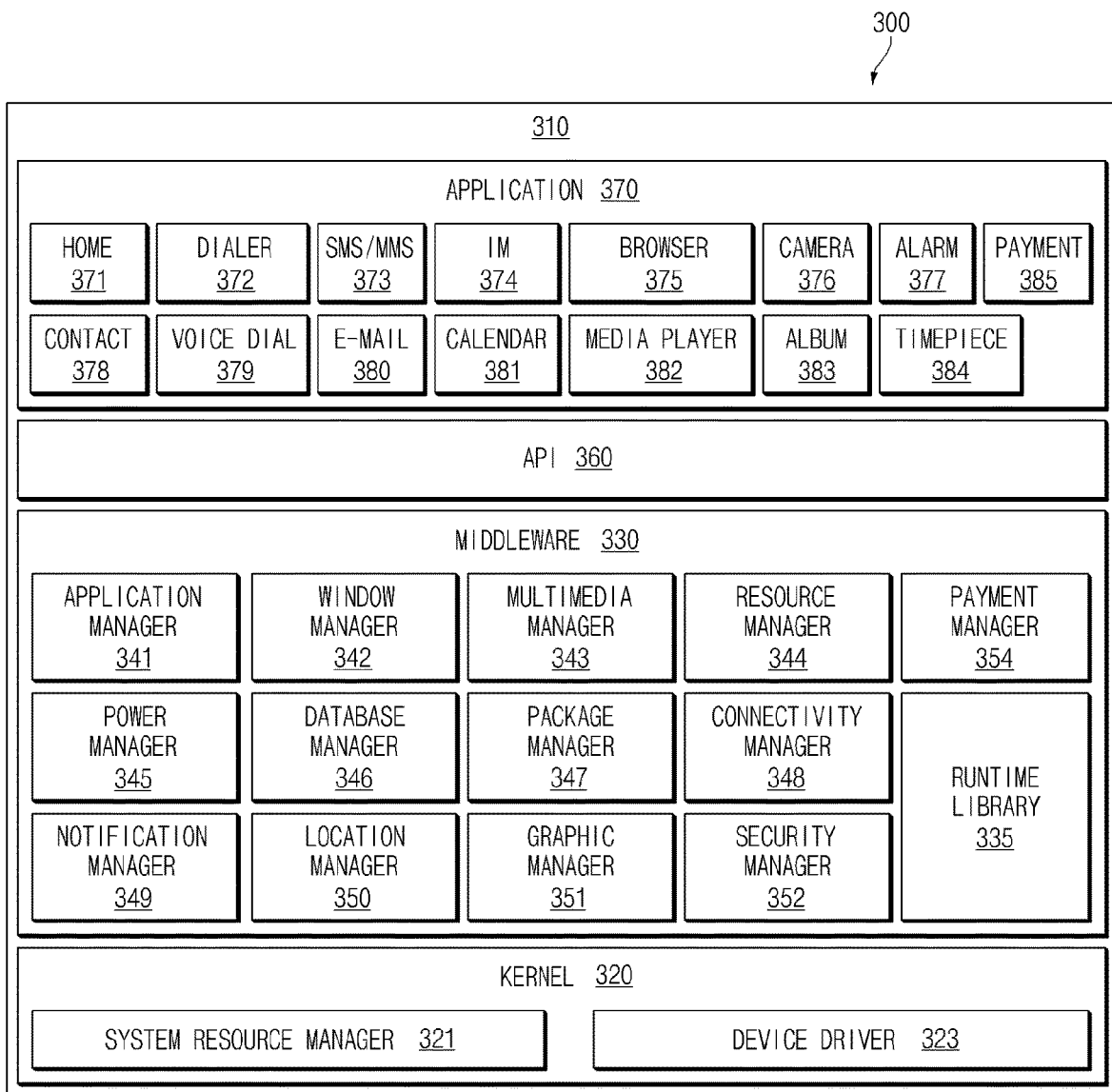
FIG. 3 illustrates a block diagram of a program module according to various embodiments.

FIG. 3 illustrates a block diagram of a program module, according to various embodiments.

According to an embodiment, a program module 310 (e.g., the program 140) may include an operating system (OS) to control resources associated with an electronic device (e.g., the electronic device 101), and/or diverse applications (e.g., the application program 147) driven on the OS. The OS may be, for example, Android, iOS, Windows, Symbian, Tizen, or bada.

According to various embodiments of the present disclosure, the program module 310 may include a kernel 320, a middleware 330, an application programming interface (API) 360, and/or an application 370. At least a portion of the program module 310 may be preloaded on an electronic device or may be downloadable from an external electronic device (e.g., the first electronic device 102, the second electronic device 104, the server 106, or the like).

According to various embodiments of the present disclosure, the kernel 320 (e.g., the kernel 141) may include, for example, a system resource manager 321 or a device driver 323. The system resource manager 321 may perform control, allocation, or retrieval of system resources. According to an embodiment, the system resource manager 321 may include a process managing unit, a memory managing unit, or a file system managing unit. The device driver 323 may include, for example, a display driver, a camera driver, a Bluetooth driver, a shared memory driver, a USB driver, a keypad driver, a Wi-Fi driver, an audio driver, or an inter-process communication (IPC) driver.

According to various embodiments of the present disclosure, the middleware 330 may provide, for example, a function that the application 370 needs in common, or may provide diverse functions to the application 370 through the API 360 to allow the application 370 to efficiently use limited system resources of the electronic device. According to an embodiment, the middleware 330 (e.g., the middleware 143) may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, or a payment manager 354.

According to various embodiments of the present disclosure, the runtime library 335 may include, for example, a library module that is used by a compiler to add a new function through a programming language while the application 370 is being executed. The runtime library 335 may perform input/output management, memory management, or capacities about arithmetic functions.

According to various embodiments of the present disclosure, the application manager 341 may manage, for example, a life cycle of at least one application of the application 370. The window manager 342 may manage a graphic user interface (GUI) resource that is used in a screen. The multimedia manager 343 may identify a format necessary for playing diverse media files, and may perform encoding or decoding of media files by using a codec suitable for the format. The resource manager 344 may manage resources such as a storage space, memory, or source code of at least one application of the application 370.

According to various embodiments of the present disclosure, the power manager 345 may operate, for example, with a basic input/output system (BIOS) to manage a battery or power, and may provide power information for an operation of an electronic device. The database manager 346 may generate, search for, or modify database that is to be used in at least one application of the application 370. The package manager 347 may install or update an application that is distributed in the form of package file.

According to various embodiments of the present disclosure, the connectivity manager 348 may manage, for example, wireless connection such as Wi-Fi or Bluetooth. The notification manager 349 may display or notify an event such as arrival message, appointment, or proximity notification in a mode that does not disturb a user. The location manager 350 may manage location information about an electronic device. The graphic manager 351 may manage a graphic effect that is provided to a user, or manage a user interface relevant thereto. The security manager 352 may provide a general security function necessary for system security, user authentication, or the like. According to an embodiment, in the case where an electronic device (e.g., the electronic device 101) includes a telephony function, the middleware 330 may further include a telephony manager for managing a voice or video call function of the electronic device.

According to various embodiments of the present disclosure, the middleware 330 may include a middleware module that combines diverse functions of the above-described elements. The middleware 330 may provide a module specialized to each OS kind to provide differentiated functions. According to another embodiment, the middleware 330 may dynamically remove a part of the preexisting elements or may add new elements thereto.

According to various embodiments of the present disclosure, the API 360 (e.g., the API 145) may be, for example, a set of programming functions and may be provided with a configuration that is variable depending on an OS. For example, in the case where an OS is Android or iOS, it may provide one API set per platform. In the case where an OS is Tizen, it may provide two or more API sets per platform.

According to various embodiments of the present disclosure, the application 370 (e.g., the application program 147) may include, for example, one or more applications capable of providing functions for a home 371, a dialer 372, an SMS/MMS 373, an instant message (IM) 374, a browser 375, a camera 376, an alarm 377, a contact 378, a voice dial 379, an e-mail 380, a calendar 381, a media player 382, an album 383, and a timepiece 384 or for offering health care (e.g., measuring an exercise quantity, blood sugar, or the like) or environment information (e.g., information of barometric pressure, humidity, temperature, or the like).

According to an embodiment, the application 370 may include an application (hereinafter referred to as "information exchanging application" for descriptive convenience) to support information exchange between an electronic device (e.g., the electronic device 101) and an external electronic device (e.g., the electronic device 102 or 104). The information exchanging application may include, for example, a notification relay application for transmitting specific information to an external electronic device, or a device management application for managing the external electronic device.

For example, the notification relay application may include a function of transmitting notification information, which arise from other applications (e.g., applications for SMS/MMS, e-mail, health care, or environmental information), to an external electronic device (e.g., the electronic device 102 or 104). According to another embodiment, the information exchanging application may receive, for example, notification information from an external electronic device and provide the notification information to a user.

According to various embodiments of the present disclosure, the device management application may manage (e.g., install, delete, or update), for example, at least one function (e.g., turn-on/turn-off of an external electronic device itself (or a part of elements) or adjustment of brightness (or resolution) of a display) of the external electronic device (e.g., the electronic device 102 or 104) which communicates with the electronic device, an application running in the external electronic device, or a service (e.g., a call service, a message service, or the like) provided from the external electronic device.

According to an embodiment, the application 370 may include an application (e.g., a health care application of a mobile medical device) that is assigned in accordance with an attribute of an external electronic device (e.g., the electronic device 102 or 104). According to an embodiment, the application 370 may include an application that is received from an external electronic device (e.g., the first electronic device 102, the second electronic device 104, or the server 106). According to an embodiment, the application 370 may include a preloaded application or a third party application that is downloadable from a server. The names of elements of the program module 310 according to the embodiment may be modifiable depending on kinds of operating systems.

According to various embodiments, at least a portion of the program module 310 may be implemented by software, firmware, hardware, or a combination of two or more thereof. At least a portion of the program module 310 may be implemented (e.g., executed), for example, by the processor (e.g., the processor 210). At least a portion of the program module 310 may include, for example, modules, programs, routines, sets of instructions, processes, or the like for performing one or more functions.

The term "module" used in this disclosure may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor (e.g., the processor 120), may cause the one or more processors to perform a function corresponding to the instruction. The computer-readable storage media, for example, may be the memory 130.

According to various embodiments of the present disclosure, a computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). According to another embodiment, the one or more instructions may contain a code made by a compiler or a code executable by an interpreter. The above hardware unit may be configured to operate via one or more software modules for performing an operation according to various embodiments, and vice versa.

Figure 4:
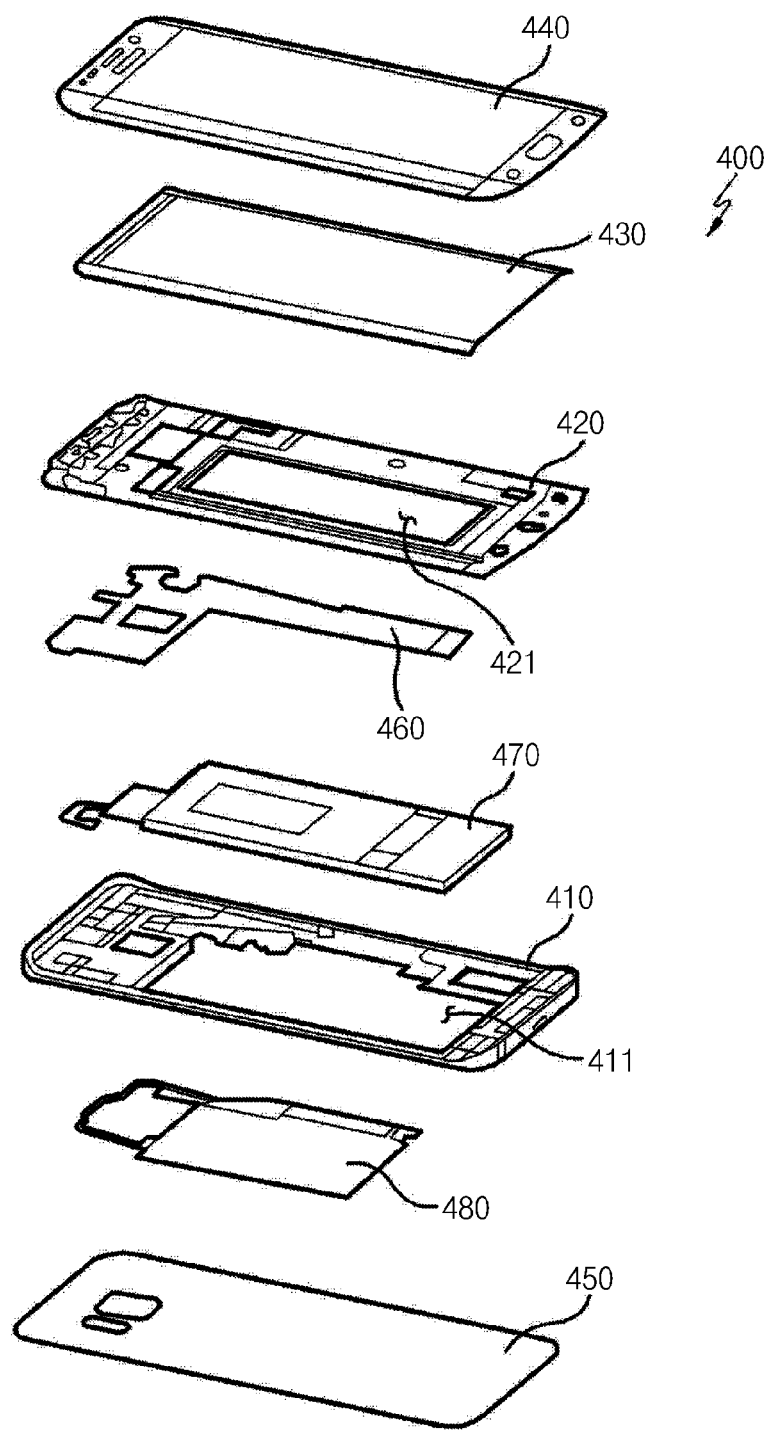
FIG. 4 is an exploded perspective view of an electronic device according to an embodiment.

FIG. 4 is an exploded perspective view of an electronic device, according to an embodiment. The electronic device of FIG. 4 may be the electronic device 101 of FIG. 1.

Referring to FIG. 4, an electronic device 400 may include a housing 410, at least one cover 440 or 450, a display panel 430, a support member 420, a circuit board 460, a battery 470, and a conductive pattern part 480.

According to various embodiments, the housing 410 may accommodate various kinds of electronic components, or the like. At least part of the housing 410 may be formed of a conductive material. For example, the housing 410 may include sidewalls forming the outer side surface of the electronic device 400, and the part exposed outside the electronic device 400 may be manufactured with a metal material. The circuit board 460 and/or the battery 470 may be accommodated inside the housing 410. For example, a processor (e.g., the processor 210 of FIG. 2), a communication module (e.g., the communication module 220 of FIG. 2), various types of interfaces (e.g., the interface 270 of FIG. 2), a power management module (e.g., the power management module 295 of FIG. 2), or the like may be mounted in the form of an integrated circuit chip on the circuit board 460. In addition, a test port 1100, a switching circuit 1500, 2500, or 3500, a communication circuit 1400, a signal distribution unit 2600, a ground part 3700, or a load 5900, which is illustrated in FIGS. 6 to 12 may be also mounted in the form of an integrated circuit chip on the circuit board 460.

According to various embodiments, the cover 440 or 450 may be manufactured with materials through which radio waves or magnetic fields at least partially pass. The cover 440 or 450 may include the front cover 440 mounted on the front surface of the housing 410 and the rear cover 450 mounted on the rear surface of the housing 410. As illustrated in FIG. 4, the front cover 440 may include a bent portion. For example, the front cover 440 may be adjacent to the display panel 430. For example, the front cover 440 may include a window member of a tempered glass material, and the display panel 430 may be mounted on the inner surface of the window member. The touch panel may be mounted between the window member and the display panel 430. For example, the front cover 440 and the display panel 430 may be used as an output device for outputting a screen and an input device for recognizing a touch input. The rear cover 450 may be mounted to face in a direction opposite to the front cover 440, and may be manufactured with the materials, through which radio waves or magnetic fields at least partially pass, for example, tempered glass or synthetic resin. For example, the front cover 440 and the rear cover 450 may be mounted in the housing 410 and may be formed of the appearance of the electronic device 400 together with the housing 410.

According to various embodiments, the support member 420 may be mounted in the housing 410. The support member 420 may be manufactured with a metal material, and may be disposed in a space formed by the housing 410 and the front cover 440. For example, the support member 420 may be interposed between the display panel 430 and the circuit board 460. The support member 420 may prevent integrated circuit chips mounted on the circuit board 460 from contacting the display panel 430. The support member 420 may prevent electromagnetic interference between the integrated circuit chips by providing a function of shielding electromagnetic waves. The support member 420 may supplement the rigidity of the electronic device 400. For example, a plurality of openings or recessed portions may be formed in the housing 410. The opening or recessed portion formed in the housing 410 may deteriorate the rigidity of the housing 410. The support member 420 may be mounted or coupled in or to the housing 410 to improve the rigidity of the housing 410 or the electronic device 400.

Although not illustrated in FIG. 4 in detail, according to various embodiments, various structures may be formed on the surfaces of the housing 410 and the support member 420 according to the arrangement of the electronic components disposed inside the electronic device 400 and the coupling structure between the housing 410 and the support member 420. For example, a space 411 or 421 for accommodating the integrated circuit chips mounted on the circuit board 460 may be formed in the housing 410 and/or the support member 420. The space for accommodating the integrated circuit chips may be implemented with a recessed shape, a rib surrounding an integrated circuit chip, or the like. According to various embodiments, a coupling boss or coupling holes that correspond to each other may be formed in the housing 410 and the support member 420. For example, in a state where the housing 410 and the support member 420 face each other or in a state where the support member 420 is accommodated in the housing 410, the housing 410 and the support member 420 may be coupled to each other, by coupling a coupling member such as a screw to a coupling member or the coupling hole.

According to various embodiments, the conductive pattern part 480 may be mounted on the housing 410 in a direction opposite to the circuit board 460. For example, the conductive pattern part 480 may be located in a space formed between the rear cover 450 and the housing 410. The conductive pattern part 480 may include at least one conductive pattern, for example, a planar coil. The conductive pattern part 480 may transmit and receive radio waves or may generate magnetic fields.

According to various embodiments, the radio waves transmitted or received through the conductive pattern part 480 or the magnetic fields generated by the conductive pattern part 480 may pass through, for example, the rear cover 450. For example, the rear cover 450 may be made of tempered glass or synthetic resin. When the rear cover 450 is made of a transparent material such as tempered glass, the structure inside the rear cover 450 and the electronic components (e.g., the conductive pattern part 480) may be concealed by forming the coating layer on the inner or outer side surface of the rear cover 450.

Figure 5:
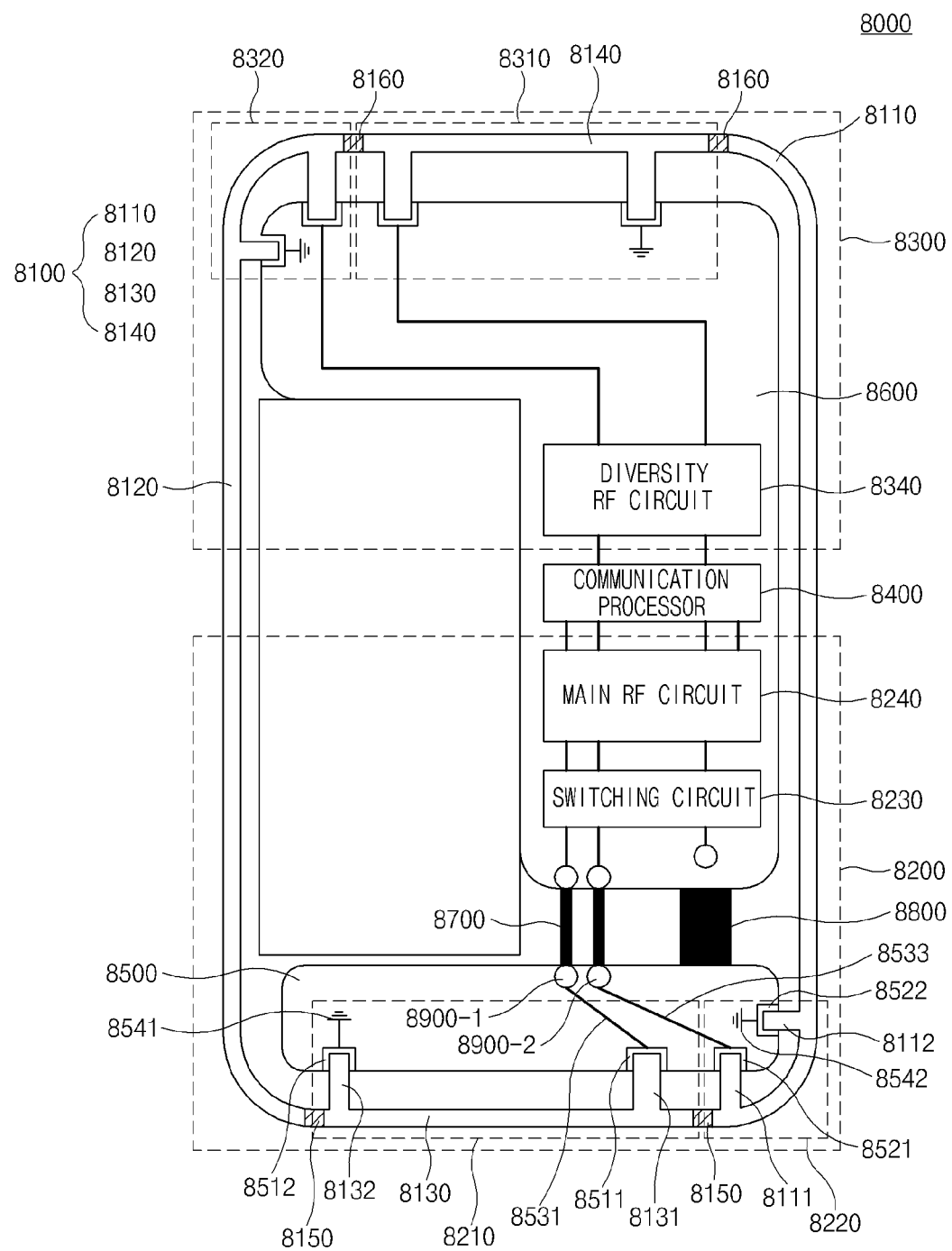
FIG. 5 illustrates an internal structure of an electronic device, according to an embodiment.

FIG. 5 illustrates an internal structure of an electronic device, according to an embodiment.

Referring to FIG. 5, an electronic device 8000 may include a metal bezel 8100 and may include a main unit 8200, which is positioned inside the metal bezel 8100 or includes a part of the metal bezel 8100, a diversity unit 8300, and a communication processor 8400.

According to various embodiments, when viewed from the front surface of the electronic device 8000, the metal bezel 8100 may include a right-side bezel 8110, a left-side bezel 8120, a lower-side bezel 8130, and an upper-side bezel 8140. According to an embodiment, the lower-side bezel 8130 may be separated from the right-side bezel 8110 and the left-side bezel 8120 by a pair of partition parts 8150 formed at regular intervals. The upper-side bezel 8140 may be separated from the right-side bezel 8110 and the left-side bezel 8120 by a pair of partition parts 8160 formed at regular intervals. According to an embodiment, the pair of partition parts 8150 or 8160 may be formed of an insulator. According to an embodiment, the pair of partition parts 8150 or 8160 may be formed in a gap of the metal bezel 8100 in a double injection molding scheme or an insert molding scheme. However, an embodiment of the present disclosure is not limited thereto. For example, a pair of partition parts 8150 and 8160 may be made of various materials having insulating properties.

According to various embodiments, the lower-side bezel 8130 may be integrated with a first feeding piece 8131. The first feeding piece 8131 may be fed by a first feeding part 8900-1 of a sub printed circuit board 8500 (hereinafter referred to as a "sub PCB"). According to an embodiment, when the sub PCB 8500 is installed in the electronic device 8000, the first feeding piece 8131 of the lower-side bezel 8130 may be connected to the first feeding part 8900-1 of a board and may be electrically connected to the first feeding part 8900-1 by a separate electrical connection member (e.g., C clip or the like).

According to various embodiments, a first feeding pad 8511 may be disposed on the sub PCB 8500. The first feeding pad 8511 may be electrically connected to the first feeding piece 8131 of the lower-side bezel 8130. The sub PCB 8500 may be a flexible printed circuit board (FPCB). According to an embodiment, a first electrical path 8531 (e.g., wiring line) from the first feeding pad 8511 to the first feeding part 8900-1 may be formed. The lower-side bezel 8130 may be at least part of the first antenna of the main unit 8200 supporting Low Band (LB) and High/Middle Band (H/MB), or H/MB. The left-side bezel 8120 and the right-side bezel 8110 may be fed in the same manner. The left-side bezel 8120 and the right-side bezel 8110 may be a part of a first antenna 8210 of the main unit 8200 supporting LB and H/MB, or H/MB.

According to various embodiments, the lower-side bezel 8130 may be integrally formed with a first ground piece 8132 at a location spaced apart from the first feeding piece 8131 by a predetermined distance. The first ground piece 8132 may be grounded to a first ground part 8541 of the sub PCB 8500. According to an embodiment, when the sub PCB 8500 is installed in the electronic device 8000, the first ground piece 8132 of the lower-side bezel 8130 may be grounded to the first ground part 8541 of the sub PCB 8500 and may be electrically connected to a first ground part 8541 by a separate electrical connection member (e.g., C clip or the like).

According to various embodiments, a first ground pad 8512 may be disposed on the sub PCB 8500. The first ground pad 8512 may be electrically connected to the first ground piece 8132 of the lower-side bezel 8130. According to an embodiment, a second electrical path 8532 (e.g., wiring line) from the first ground pad 8512 to the first ground part 8541 may be formed.

According to various embodiments, the right-side bezel 8110 may be integrally formed with a second feeding piece 8111. The second feeding piece 8111 may be fed by a second feeding part 8900-2 of the sub PCB 8500. According to an embodiment, when the sub PCB 8500 is installed in the electronic device 8000, the second feeding piece 8111 of the right-side bezel 8110 may be connected to the second feeding part 8900-2 of a board and may be electrically connected to the second feeding part 8900-2 by a separate electrical connection member (e.g., C clip or the like).

According to various embodiments, a second feeding pad 8521 may be disposed on the sub PCB 8500. The second feeding pad 8521 may be electrically connected to the second feeding piece 8111 of the lower-side bezel 8130. According to an embodiment, a third electrical path 8533 (e.g., wiring line) from the second feeding pad 8521 to the second feeding part 8900-2 may be formed. The right-side bezel 8110 may be a part of a second antenna 8220 of the main unit 8200 supporting LB and H/MB, or H/MB.

According to various embodiments, the right-side bezel 8110 may be formed integrally with the second feed piece 8131 spaced apart from a partition part by a predetermined distance. A second ground piece 8112 may be grounded to a second ground part 8542 of a PCB. According to an embodiment, when the PCB is installed in the electronic device 8000, the second ground piece 8112 of the right-side bezel 8110 may be grounded to the second ground part 8542 of the PCB and may be electrically connected to the second ground part 8542 by a separate electrical connection member (e.g., C clip or the like).

According to various embodiments, a second ground pad 8522 may be disposed on the PCB. The second ground pad 8522 may be electrically connected to the second ground piece 8112 of the right-side bezel 8110. According to an embodiment, a fourth electrical path (e.g., wiring line) from the second ground pad 8522 to the second ground part 8542 may be formed.

According to various embodiments of the present disclosure, the feeding part, the feeding pad, ground part, and the ground pad of the main unit 8200 may be disposed on the sub PCB 8500. An RF circuit 8240 of the main unit 8200 and an RF circuit 8340 of the diversity unit 8300 may be disposed on a main PCB 8600. For example, the main PCB 8600 and the sub PCB 8500 may be connected to a FPCB 8800. The sub PCB 8500 and the FPCB 8800 may be integrally implemented.

According to various embodiments of the present disclosure, the sub PCB 8500 may be disposed in the electronic device 8000 to be lower than the main printed circuit board (hereinafter referred to as the main PCB 8600) on a vertical line. As such, the components included in the sub PCB 8500 may be further spaced apart from the antenna. In addition, relatively thick components such as a USB connector, a speaker, and the like may be disposed on the sub PCB 8500. The components on the main PCB 8600 may be connected to the USB connector, the speaker, or the like via the FPCB 8800.

According to various embodiments of the present disclosure, the transmission signal or the reception signal of the RF circuit 8240 of the main unit 8200 may be transmitted to the first feeding part 8900-1 or the second feeding part 8900-2 of the sub PCB 8500 by coaxial lines 8700. For example, the first electrical path 8531 and the second electrical path 8532 may be electrically connected to a switching circuit 8230 through the coaxial lines 8700.

According to various embodiments, the transmission or reception signal of the RF circuit 8240 of the main unit 8200 may be transmitted to the first feeding part 8900-1 or the second feeding part 8900-2 of the sub PCB 8500 through the FPCB 8800.

According to various embodiments of the present disclosure, the diversity unit 8300 may include a third antenna 8310 and a fourth antenna 8320. The third antenna 8310 may include a part of the upper-side bezel 8140, and the fourth antenna 8320 may include a part of the left-side bezel 8120 or the right-side bezel 8110.

According to various embodiments of the present disclosure, third antenna 8310 may support LB and H/MB, or H/MB and the fourth antenna 8320 may support H/MB or LB and H/MB. The feeding part and the feeding pad of the diversity unit 8300 and the ground part and the ground pads thereof may be disposed on the main PCB 8600. In the diversity unit 8300, electrical paths connecting the feeding part to the feeding pad and electrical paths connecting the ground part to the ground pad may be disposed on the main PCB 8600.

According to various embodiments, when the right-side bezel 8110 is used as the second antenna 8220 in the main unit 8200 for separating the signals between the antennas, the diversity unit 8300 may use the left-side bezel 8120, which is located in the opposite direction, as the fourth antenna 8320. Alternatively, when the left-side bezel 8120 is used as the second antenna 8220 in the main unit 8200, the diversity unit 8300 may use the right-side bezel 8110, which is located in the opposite direction, as the fourth antenna 8320.

Figure 6:
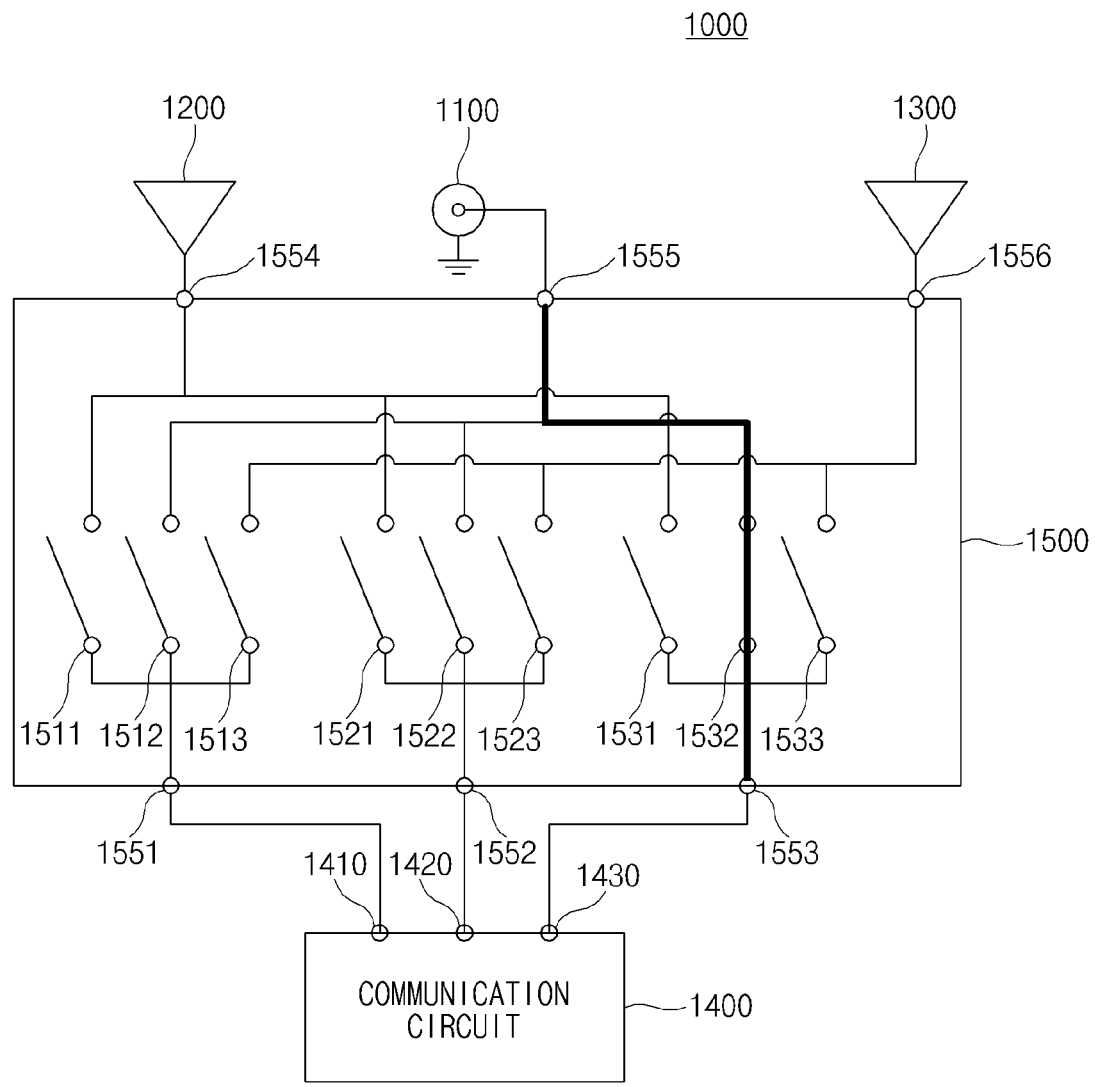
FIG. 6 illustrates a connection relationship among a communication circuit, a switching circuit, a test port, and an antenna of an electronic device, according to an embodiment.

FIG. 6 illustrates a connection relationship among a communication circuit, a switching circuit, a test port, and an antenna of an electronic device, according to an embodiment.

Referring to FIG. 6, an electronic device 1000 (e.g., the electronic device 101, the electronic device 200, the electronic device 400, or the electronic device 8000) may include the test port 1100, a first antenna 1200, a second antenna 1300, the communication circuit 1400, and the switching circuit 1500.

According to various embodiments of the present disclosure, the test port 1100 may be positioned inside the housing of the electronic device 1000. At least part of the test port 1100 may be exposed outside the housing of the electronic device 1000. For example, the test port 1100 may be connected to test equipment that tests the first antenna 1200, the second antenna 1300, and/or the communication circuit 1400. For example, the test port 1100 may be a receptacle capable of accommodating a plug connected to a coaxial cable. The test port 1100 may be electrically connected to the switching circuit 1500. The test port 1100 may be electrically connected to at least one of the first antenna 1200, the second antenna 1300, or the communication circuit 1400 through the switching circuit 1500. At least one of the first antenna 1200, the second antenna 1300, and/or the communication circuit 1400 may be tested through the test port 1100.

According to various embodiments of the present disclosure, the first antenna 1200 may be positioned inside the housing or may be formed in a part of the housing. For example, the first antenna 1200 may include a part of a metal bezel (e.g., the lower-side bezel 8130 of FIG. 5) included in the housing. For example, the first antenna 1200 may be electrically connected to the switching circuit 1500 and may be electrically connected to the communication circuit 1400 through the switching circuit 1500. In the case where the first antenna 1200 and the communication circuit 1400 are electrically connected to each other, the first antenna 1200 may transmit a signal, which is received from the outside, to the communication circuit 1400 and may radiate a signal, which is transmitted from the communication circuit 1400, to the outside. According to another embodiment, the first antenna 1200 may be electrically connected to the test port 1100 through the switching circuit 1500.

According to various embodiments of the present disclosure, the second antenna 1300 may be positioned inside the housing or may form a part of the housing. For example, the second antenna 1300 may include a part of a metal bezel (e.g., the right-side bezel 8110 of FIG. 5) included in the housing. For example, the second antenna 1300 may be electrically connected to the switching circuit 1500 and may be electrically connected to the communication circuit 1400 through the switching circuit 1500. In the case where the second antenna 1300 and the communication circuit 1400 are electrically connected to each other, the second antenna 1300 may transfer a signal, which is received from the outside, to the communication circuit 1400 and may radiate a signal, which is transmitted from the communication circuit 1400, to the outside. The frequency band of the signal transmitted through the second antenna 1300 may be different from the frequency band of the signal transmitted through the first antenna 1200. According to another embodiment, the second antenna 1300 may be electrically connected to the test port 1100 through the switching circuit 1500.

According to various embodiments of the present disclosure, the communication circuit 1400 may be included in the housing of the electronic device 1000. For example, the communication circuit 1400 may be an RF circuit (e.g., the RF module 227 of FIG. 2). The communication circuit 1400 of an electronic device according to various embodiments may include at least one of a first port 1410 for the first frequency band, a second port 1420 for the second frequency band, and/or a third port 1430 for the third frequency band.

According to various embodiments of the present disclosure, the first port 1410 may be connected to a first transmitter/receiver circuit that transmits or receives a signal of the first frequency band. The second port 1420 may be connected to a second transmitter/receiver circuit that transmits or receives a signal of the second frequency band. The third port 1430 may be connected to a third transmitter/receiver circuit that transmits or receives a signal of the third frequency band. The first transmitter/receiver circuit, the second transmitter/receiver circuit, and the third transmitter/receiver circuit may be included in the communication circuit 1400. According to an embodiment, the third frequency band may be higher in frequency than the second frequency band, and the second frequency band may be higher in frequency than the first frequency band. For example, the first frequency band may be about 600 MHz to about 1 GHz, the second frequency band may be about 1.6 GHz to about 2.1 GHz, and the third frequency band may be about 1.8 GHz to about 2.7 GHz.

According to various embodiments of the present disclosure, each of the first port 1410, the second port 1420, and the third port 1430 may be electrically connected to the switching circuit 1500. For example, the first port 1410, the second port 1420, and the third port 1430 may be selectively connected to at least one of the test port 1100, the first antenna 1200 or the second antenna 1300 through the switching circuit 1500. For example, the first port 1410 may be connected to the first antenna 1200 or the second antenna 1300 as well as the test port 1100. According to another embodiment, the first port 1410 may be connected to all of the test port 1100, the first antenna 1200, and the second antenna 1300. In addition, the second port 1420 and the third port 1430 may be similar to the first port 1410.

According to various embodiments, the communication circuit 1400 may include the first port 1410 and the second port 1420 and may not include the third port 1430. In this case, the first port 1410 may be connected to a circuit that transmits and receives signals of the first frequency band and the second frequency band, and the second port 1420 may be connected to a circuit that transmits and receives the signal of the third frequency band.

According to various embodiments of the present disclosure, the switching circuit 1500 may include a plurality of switches. The number of switches included in the switching circuit 1500 may be different depending on the band that the communication circuit 1400 supports. For example, the switching circuit 1500 may include nine switches. The switching circuit 1500 may include a plurality of ports, for example, six terminals. Each of a plurality of terminals of the switching circuit 1500 may be connected to three switches. For example, one end of each of a first switch 1511, a second switch 1512, and a third switch 1513 may be connected to a first terminal 1551; one end of each of a fourth switch 1521, a fifth switch 1522, and a sixth switch 1523 may be connected to a second terminal 1552; and one end of each of a seventh switch 1531, an eighth switch 1532, and a ninth switch 1533 may be connected to a third terminal 1553. According to another embodiment, an opposite end of each of the first switch 1511, the fourth switch 1521, and the seventh switch 1531 may be connected to a fourth terminal 1554; the opposite end of each of the second switch 1512, the fifth switch 1522, and the eighth switch 1532 may be connected to a fifth terminal 1555; and an opposite end of each of the third switch 1513, the sixth switch 1523, and the ninth switch 1533 may be connected to a sixth terminal 1556. For example, the switching circuit 1500 may be a 3-pole 3-throw (3P3T) switch.

According to various embodiments, the switching circuit 1500 of the electronic device 1000 may be electrically connected to at least one of the test port 1100, the first antenna 1200, the second antenna 1300, or the communication circuit 1400. Three terminals positioned in one side of the switching circuit 1500 may be electrically connected to the first port 1410, the second port 1420, and the third port 1430 of the communication circuit 1400, respectively. Three terminals positioned in the opposite side of the switching circuit 1500 may be electrically connected to the first antenna 1200, the second antenna 1300, and the test port 1100, respectively. For example, the first terminal 1551 may be connected to the first port 1410 of the communication circuit 1400; the second terminal 1552 may be connected to the second port 1420 of the communication circuit 1400; and the third terminal 1553 may be connected to the third port 1430 of the communication circuit 1400. For another example, the fourth terminal 1554 may be connected to the first antenna 1200; and the fifth terminal 1555 may be connected to the test port 1100; and the sixth terminal 1556 may be connected to the second antenna 1300.

According to an embodiment, the switching circuit 1500 may be configured to separately connect each of the first port 1410, the second port 1420, and the third port 1430 to one or more of the first antenna 1200, the second antenna 1300, or the test port 1100. For example, as illustrated in FIG. 6, when the eighth switch 1532 is closed, the switching circuit 1500 may electrically connect the third port 1430 to the test port 1100. In this case, the communication circuit 1400 may be connected to the third terminal 1553; the third terminal 1553 may be connected to the fifth terminal 1555 through the eighth switch 1532; and the fifth terminal 1555 may be connected to the test port 1100. For another example, when the fifth switch 1522 is closed, the switching circuit 1500 may electrically connect the second port 1420 to the test port 1100. For another example, when the second switch 1512 is closed, the switching circuit 1500 may electrically connect the first port 1410 to the test port 1100. For example, the switching circuit 1500 may connect the first port 1410 to the first antenna 1200 or the second antenna 1300, may connect the second port 1420 to the first antenna 1200 or the second antenna 1300, and may connect the third port 1430 to the first antenna 1200 or the second antenna 1300.

According to an embodiment, the switching circuit 1500 may connect one of the first port 1410, the second port 1420, or the third port 1430 to the test port 1100 during the manufacture of the electronic device 1000. For example, the switching circuit 1500 may connect the test port 1100 to at least one of the first port 1410, the second port 1420, or the third port 1430 so as to test a transmitter/receiver circuit connected to each of the first port 1410, the second port 1420 and the third port 1430 during the manufacturing process of the electronic device 1000. According to another embodiment, since the test port 1100 is exposed outside of the housing, the transmitter/receiver circuit may be tested by connecting the test port 1100 to at least one of the first port 1410, the second port 1420, or the third port 1430 after the manufacturing process.

Although not illustrated in FIG. 6, the switching circuit 1500 may include a controller. The controller may control the opening and closing of a plurality of switches included in the switching circuit 1500. The controller may receive a control command from a communication processor (e.g., the communication processor of FIG. 12) and may control a plurality of switches based on the received control command.

According to various embodiments, in the case where the communication circuit 1400 includes the first port 1410 and the second port 1420 and does not include the third port 1430, the switching circuit 1500 may be configured to selectively connect each of the first port 1410 and the second port 1420 to one of the first antenna 1200, the second antenna 1300, or the test port 1100. In this case, the switching circuit 1500 may be a 2-pole 3-throw (2P3T) switch (e.g., a switching circuit 2500 of FIG. 7) including five terminals and six switches.

Figure 7:
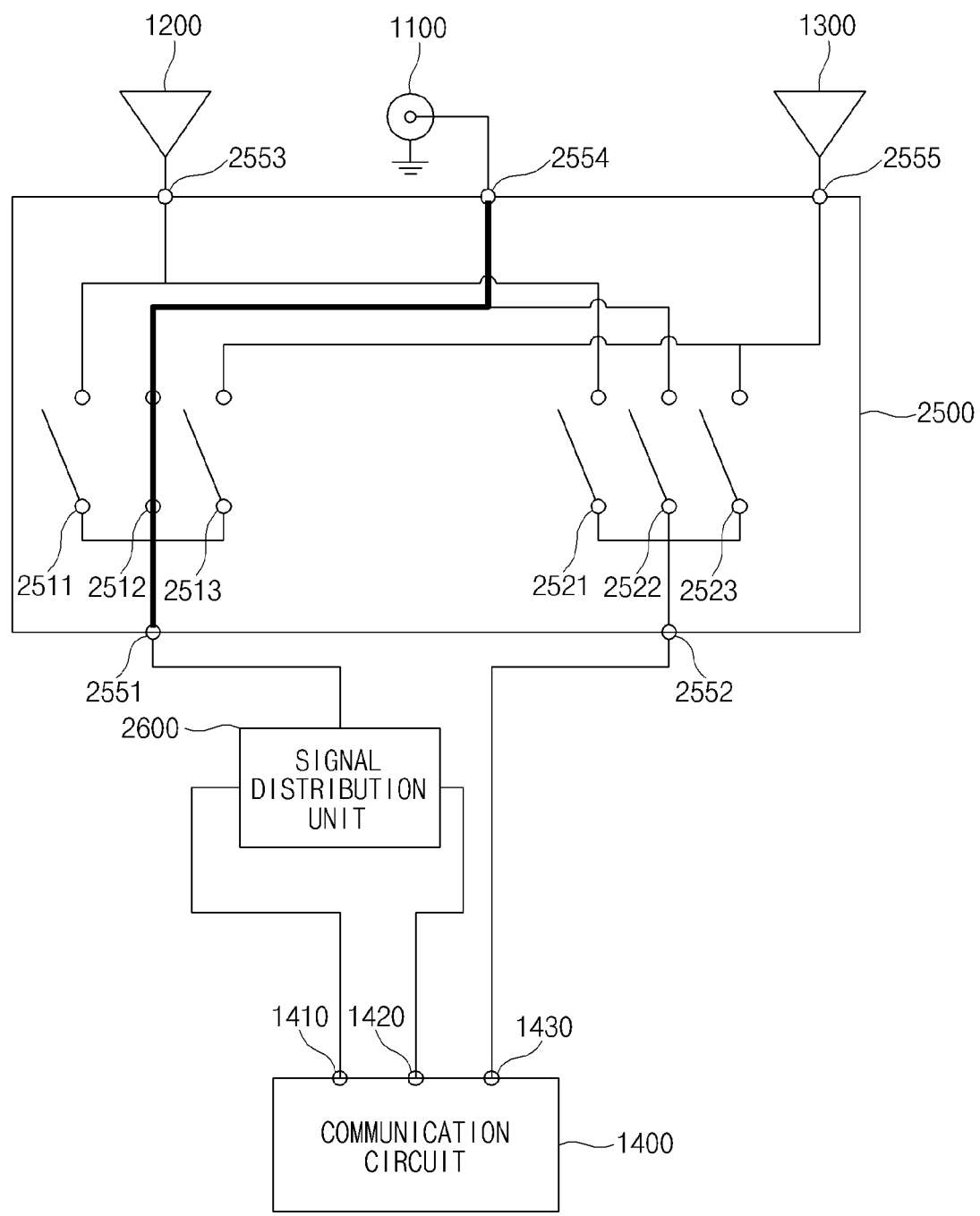
FIG. 7 illustrates a connection relationship among a communication circuit, a signal distribution unit, a switching circuit, a test port, and an antenna of an electronic device, according to an embodiment.

FIG. 7 illustrates a connection relationship among a communication circuit, a signal distribution unit, a switching circuit, a test port, and an antenna of an electronic device, according to an embodiment. For convenience of description, a description that is given with reference to FIG. 6 will not be repeated here.

Referring to FIG. 7, an electronic device 2000 (e.g., the electronic device 101, the electronic device 200, the electronic device 400, or the electronic device 8000) may further include the signal distribution unit 2600 interposed between the communication circuit 1400 and the switching circuit 2500.

According to various embodiments of the present disclosure, the signal distribution unit 2600 may be electrically connected to two ports of the first port 1410, the second port 1420 and the third port 1430. For example, the signal distribution unit 2600 may be connected to the first port 1410 and the second port 1420. The signal distribution unit 2600 may be electrically connected to the switching circuit 2500. The signal distribution unit 2600 may selectively transmit one signal of signals transmitted from each of the connected two ports 1410 and 1420, to the switching circuit 2500. According to another embodiment, the signal distribution unit 2600 may transmit a signal transmitted through the switching circuit 2500, to one of the two ports 1410 and 1420. The signal distribution unit 2600 may selectively connect one port of the first port 1410 and the second port 1420 to the switching circuit 2500. According to another embodiment, the signal distribution unit 2600 may simultaneously connect the first port 1410 and the second port 1420 to the switching circuit 2500. For example, the signal distribution unit 2600 may include at least one of a diplexer, a duplexer, or a switch.

According to various embodiments of the present disclosure, the switching circuit 2500 may include, for example, six switches. For example, the switching circuit 2500 may include five terminals. For example, one end of each of a first switch 2511, a second switch 2512, and a third switch 2513 may be connected to a first terminal 2551; and one end of each of the fourth switch 2521, a fifth switch 2522, and a sixth switch 2523 may be connected to a second terminal 2552. According to another embodiment, an opposite end of each of the first switch 2511 and the fourth switch 2521 may be connected to a third terminal 2553; an opposite end of each of a second switch 2512 and a fifth switch 2522 may be connected to a fourth terminal 2554; and an opposite end of each of a third switch 2513 and a sixth switch 2523 may be connected to a fifth terminal 2555. For example, the switching circuit 2500 may be a 2-pole 3-throw (2P3T) switch.

According to various embodiments, the switching circuit 2500 of the electronic device 2000 may be electrically connected to at least one of the test port 1100, the first antenna 1200, the second antenna 1300, the signal distribution unit 2600, or the communication circuit 1400. For example, the first terminal 2551 of the switching circuit 2500 may be connected to the signal distribution unit 2600, and the second terminal 2552 may be connected to the third port 1430 of the communication circuit 1400. The third terminal 2553 of the switching circuit 2500 may be connected to the first antenna 1200; and the fourth terminal 2554 may be connected to the test port 1100; and the fifth terminal 2555 may be connected to the second antenna 1300.

According to an embodiment, the switching circuit 2500 may be configured to electrically connect each of the signal distribution unit 2600 and the third port 1430 to the first antenna 1200, the second antenna 1300, or the test port 1100. For example, as illustrated in FIG. 7, when the second switch 2512 is closed, the switching circuit 2500 may electrically connect the signal distribution unit 2600 to the test port 1100. In this case, the signal distribution unit 2600 may be connected to the first terminal 2551; the first terminal 2551 may be connected to the fourth terminal 2554 through the second switch 2512; and the fourth terminal 2554 may be connected to the test port 1100. In this case, the signal distribution unit 2600 may selectively connect at least one of the first port 1410 or the second port 1420 of the communication circuit 1400 to the test port 1100. For another example, the switching circuit 2500 may electrically connect the third port 1430 to the test port 1100. For example, the switching circuit 2500 may connect the signal distribution unit 2600 to the first antenna 1200 or the second antenna 1300 and may connect the third port 1430 to the first antenna 1200 or the second antenna 1300.

According to an embodiment, the switching circuit 2500 may connect the signal distribution unit 2600 or the third port 1430 to the test port 1100 during the manufacture of the electronic device 2000.

Although not illustrated in FIG. 7, the switching circuit 2500 may include a controller capable of controlling the opening and closing of a plurality of switches based on the control command received from the communication processor.

Figure 8:
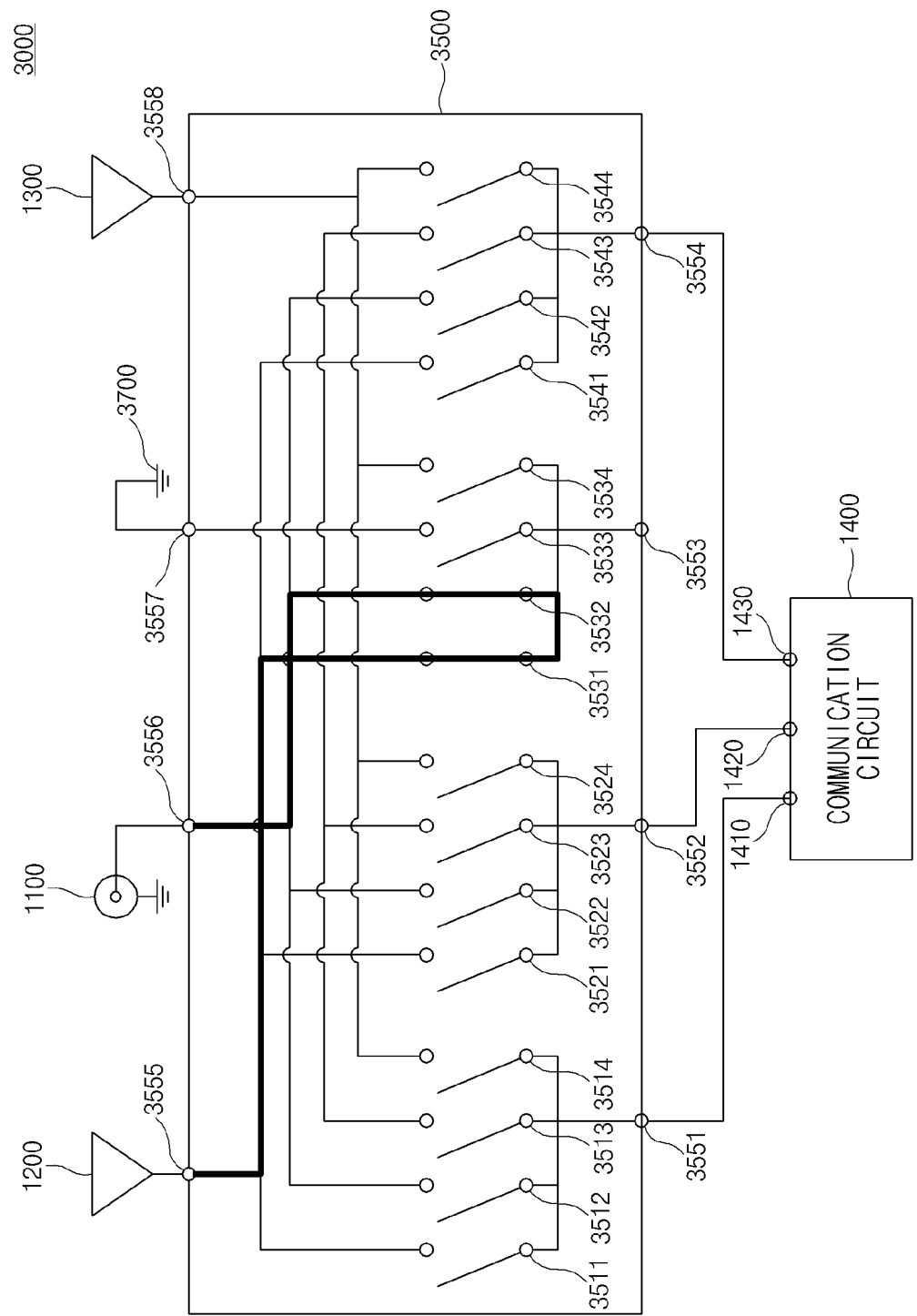
FIG. 8 illustrates a connection relationship among a communication circuit, a switching circuit, a test port, and an antenna of an electronic device, according to an embodiment.

FIG. 8 illustrates a connection relationship among a communication circuit, a switching circuit, a test port, and an antenna of an electronic device, according to an embodiment. For descriptive convenience, a description of a configuration given with reference to FIGS. 6 and 7 will not be repeated here.

Referring to FIG. 8, an electronic device 3000 (e.g., the electronic device 101, the electronic device 200, the electronic device 400, or the electronic device 8000) may further include the ground part 3700. The ground part 3700 may be electrically connected to the switching circuit 3500.

According to various embodiments of the present disclosure, the switching circuit 3500 may include, for example, sixteen switches. For example, the switching circuit 3500 may include eight terminals. For example, one end of each of first to fourth switches 3511 to 3514 may be connected to a first terminal 3551; one end of each of fifth to eighth switches 3521 to 3524 may be connected to a second terminal 3552; one end of each of ninth to twelfth switches 3531 to 3534 may be connected to a third terminal 3553; and one end of each of thirteenth to sixteenth switches 3541 to 3544 may be connected to a fourth terminal 3554. According to another embodiment, the opposite end of each of the first switch 3511, the fifth switch 3521, the ninth switch 3531, and the thirteenth switch 3541 may be connected to a fifth terminal 3555; the opposite end of each of the second switch 3512, the sixth switch 3522, the tenth switch 3532, and the fourteenth switch 3542 may be connected to a sixth terminal 3556; the opposite end of each of the third switch 3513, the seventh switch 3523, the eleventh switch 3533, and the fifteenth switch 3543 may be connected to a seventh terminal 3557; and the opposite end of each of the fourth switch 3514, the eighth switch 3524, the twelfth switch 3534, and the sixteenth switch 3544 may be connected to a eighth terminal 3558. For example, the switching circuit 3500 may be a 4-pole 4-throw (4P4T) switch.

According to various embodiments, the switching circuit 1500 of the electronic device 1000 may be electrically connected to at least one of the test port 1100, the first antenna 1200, the second antenna 1300, or the communication circuit 1400. For example, the first terminal 3551 of the switching circuit 3500 may be connected to the first port 1410 of the communication circuit 1400; the second terminal 3552 of the switching circuit 3500 may be connected to the second port 1420 of the communication circuit 1400; and the fourth terminal 3554 of the switching circuit 3500 may be connected to the third port 1430 of the communication circuit 1400. The fifth terminal 3555 of the switching circuit 3500 may be connected to the first antenna 1200; the sixth terminal 3556 may be connected to the test port 1100; the seventh terminal 3557 may be connected to the ground part 3700; and the eighth terminal 3558 may be connected to the second antenna 1300.

According to an embodiment, the switching circuit 3500 may include an opened terminal 3553 (hereinafter referred to as a "third terminal 3553"). For example, the third terminal 3553 of the switching circuit 3500 may be an opened terminal that is not connected to other elements.

According to an embodiment, the switching circuit 3500 may be configured to connect the test port 1100 to the first antenna 1200 or the second antenna 1300 through a path extending from the opened terminal. For example, as illustrated in FIG. 8, when the ninth switch 3531 and the tenth switch 3532, which are connected to the opened terminal, are closed, the switching circuit 3500 may electrically connect the first antenna 1200 to the test port 1100. In this case, the first antenna 1200 may be connected to the fifth terminal 3555; the fifth terminal 3555 may be connected to the sixth terminal 3556 through the ninth switch 3531 and the tenth switch 3532; and the sixth terminal 3556 may be connected to the test port 1100. For another example, when the tenth switch 3532 and the twelfth switch 3534 are closed, the switching circuit 3500 may electrically connect the second antenna 1300 to the test port 1100.

As described above, the switching circuit 3500 may selectively connect the test port 1100 to the first antenna 1200 or the second antenna 1300. The first antenna 1200 and the second antenna 1300 may be tested without damaging the electronic device 3000 by using test equipment connected to the test port 1100, by connecting the test port 1100 to the first antenna 1200 or the second antenna 1300.

Figure 9A:
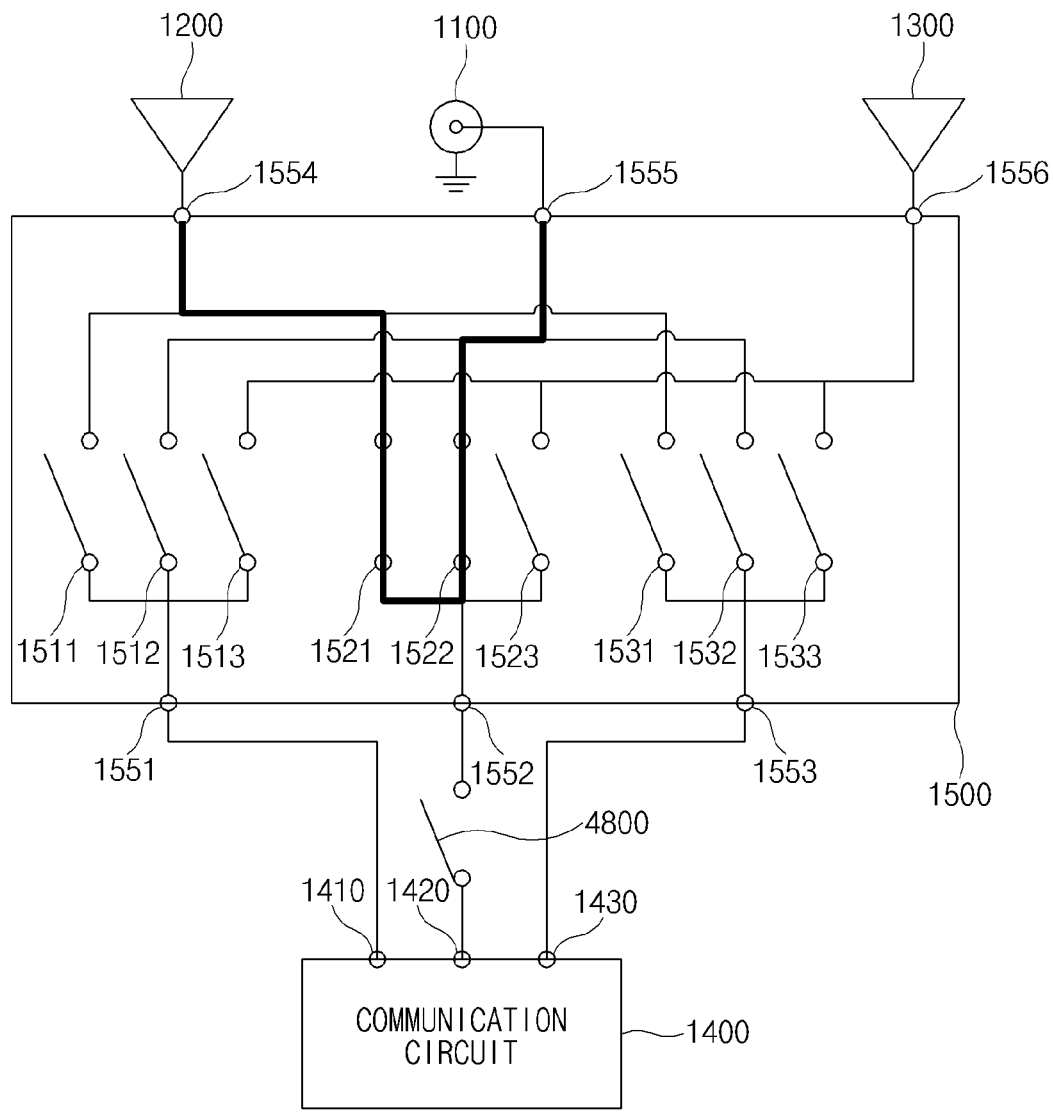
FIGS. 9A and 9B illustrate a connection relationship among a communication circuit, a switching circuit, a test port, and an antenna of an electronic device, according to an embodiment.
Figure 9B:
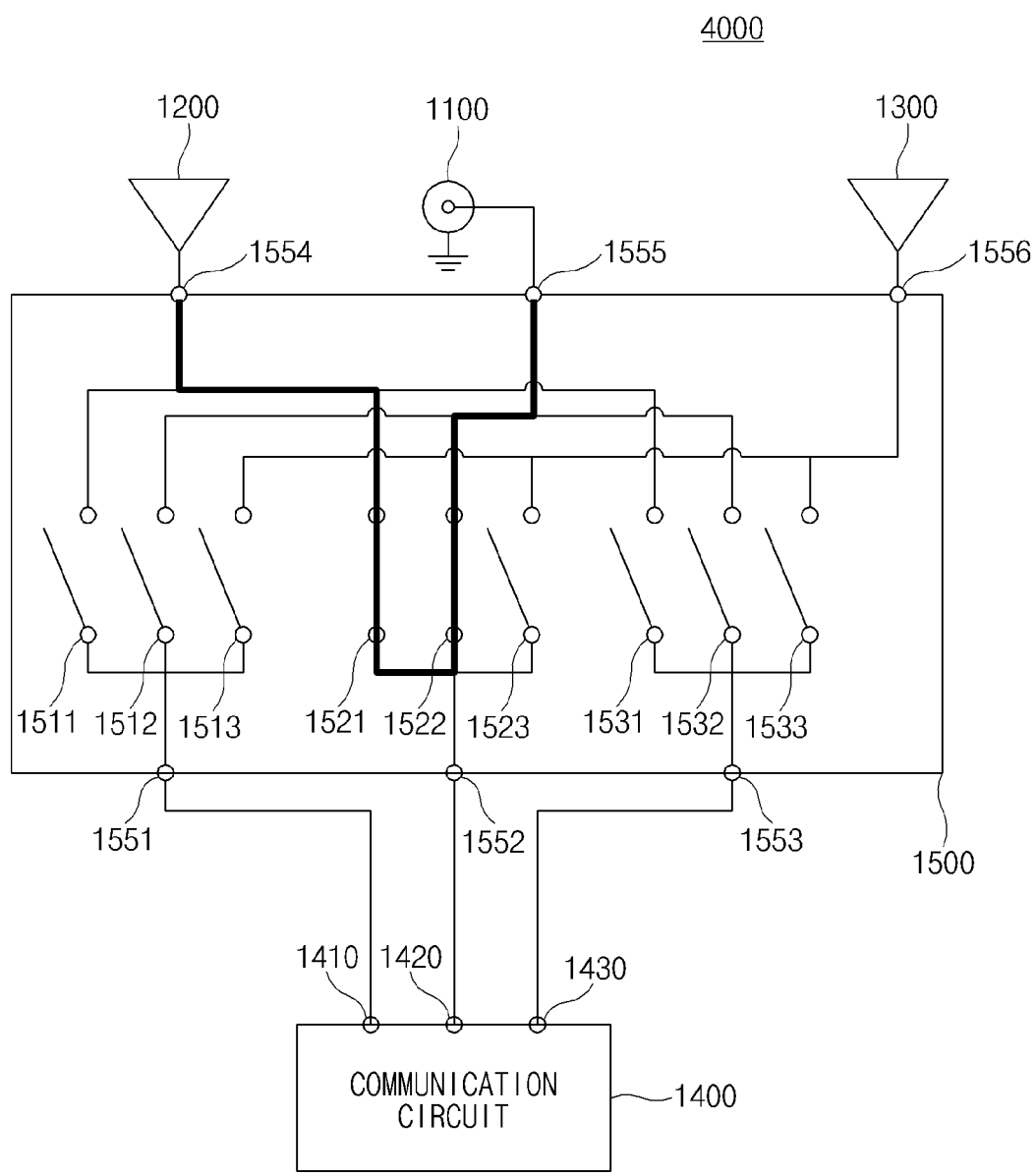

FIGS. 9A and 9B illustrate a connection relationship among a communication circuit, a switching circuit, a test port, and an antenna of an electronic device, according to an embodiment. For convenience of description, a description given with reference to FIGS. 6 to 8 will not be repeated here.

Referring to FIGS. 9A and 9B, an electronic device 4000 (e.g., the electronic device 101, the electronic device 200, the electronic device 400, or the electronic device 8000) may further include a switch interposed between a communication circuit and a switching circuit.

According to various embodiments of the present disclosure, the switching circuit 1500 may include a plurality of switches, for example, nine switches. The switching circuit 1500 may include a plurality of ports, for example, six terminals. The second terminal 1552 of the switching circuit 1500 may be connected to a switch 4800.

According to various embodiments of the present disclosure, the switching circuit 1500 may connect the test port 1100 to the first antenna 1200 or the second antenna 1300. For example, as illustrated in FIGS. 9A and 9B, when the fourth switch 1521 and the fifth switch 1522 are closed, the switching circuit 1500 may electrically connect the first antenna 1200 to the test port 1100. In this case, the first antenna 1200 may be connected to the fourth terminal 1554; the fourth terminal 1554 may be connected to the fifth terminal 1555 through the fourth switch 1521 and the fifth switch 1522; and the fifth terminal 1555 may be connected to the test port 1100. For another example, when the fifth switch 1522 and the sixth switch 1523 are closed, the switching circuit 1500 may electrically connect the second antenna 1300 to the test port 1100.

According to various embodiments of the present disclosure, the switch 4800 may electrically connect or disconnect the switching circuit 1500 to or from a part of the communication circuit 1400. For example, the switch 4800 may electrically connect or disconnect the second port 1420 of the communication circuit 1400 to or from the second terminal 1552 of the switching circuit 1500.

According to various embodiments of the present disclosure, when the test port 1100 is connected to the first antenna 1200 so as to test the first antenna 1200, in the case where the second terminal 1552 and the second port 1420 are connected with each other, the load included in the transmitter/receiver circuit connected to the second port 1420 may be connected to the first antenna 1200 in parallel. In this case, the characteristics of the first antenna 1200 may be changed. Accordingly, as illustrated in FIG. 9A, the electronic device may test the first antenna 1200 in a state where the switch 4800 is opened.

According to an embodiment, as illustrated in FIG. 9B, the test port 1100 may be connected to the first antenna 1200 in a state where the second terminal 1552 and the second port 1420 are connected to each other. In this case, since the load included in the transmitter/receiver circuit connected to the second port 1420 is connected to the first antenna 1200 in parallel, the test may be performed in consideration of the load connected in parallel. For example, the impedance of the transceiver circuit may be 50Ω. Accordingly, the test for the first antenna 1200 may be performed in consideration of the first antenna 1200 and the load of 50Ω that is connected to the first antenna 1200 in parallel.

Although not illustrated in FIGS. 9A and 9B, the electronic device may include a controller capable of controlling the opening and closing of a switch based on the control command received from the communication processor.

Figure 10:
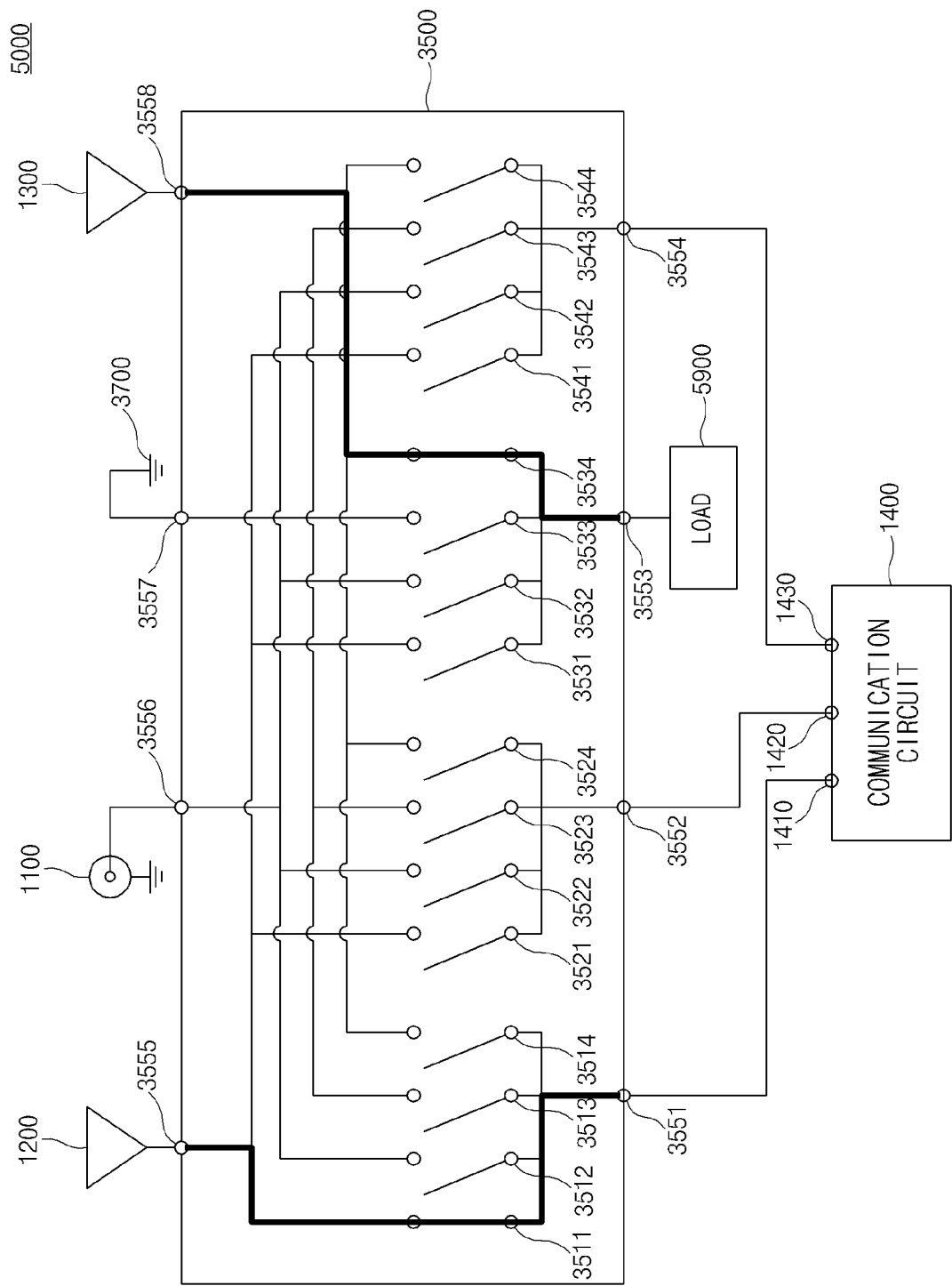
FIG. 10 illustrates a connection relationship among a communication circuit, a load, a switching circuit, a ground part, a test port, and an antenna of an electronic device, according to an embodiment.

FIG. 10 illustrates a connection relationship among a communication circuit, a load, a switching circuit, a ground part, a test port, and an antenna of an electronic device, according to an embodiment. For convenience of description, a description given with reference to FIGS. 6 to 9 will not be repeated here.

Referring to FIG. 10, an electronic device 5000 (e.g., the electronic device 101, the electronic device 200, the electronic device 400, or the electronic device 8000) may further include the ground part 3700 and the load 5900. The ground part 3700 may be electrically connected to the switching circuit 3500.

According to various embodiments of the present disclosure, the load 5900 may be electrically connected to the switching circuit 3500. For example, the load 5900 may be connected to the third terminal 3553 of the switching circuit 3500. The load 5900 may be connected to the first antenna 1200 or the second antenna 1300 through the switching circuit 3500. When the load 5900 is connected to an antenna, the resonance frequency of the antenna may be changed. The load 5900 may have impedance that increases, for example, the resonance frequency of the antenna. The load 5900 may be a variable impedance circuit.

According to an embodiment, the switching circuit 3500 may selectively connect one or more of the first port 1410, the second port 1420, or the third port 1430 to one or more of the first antenna 1200 or the second antenna 1300. For example, as illustrated in FIG. 10, when the first switch 3511 is closed, the switching circuit 3500 may electrically connect the first port 1410 to the first antenna 1200 through the first terminal 3551, the first switch 3511, and the fifth terminal 3555. When the first port 1410 and the first antenna 1200 are connected to each other, the electronic device 5000 may perform communication by using the first antenna 1200 and the first transmitter/receiver circuit. For another example, when the eighth switch 3524 is closed (not illustrated), the switching circuit 3500 may electrically connect the second port 1420 to the second antenna 1300.

According to an embodiment, the switching circuit 3500 may selectively connect the load 5900 to the first antenna 1200 or the second antenna 1300. For example, as illustrated in FIG. 10, when the twelfth switch 3534 is closed, the switching circuit 3500 may electrically connect the load 5900 to the second antenna 1300 through the third terminal 3553, the twelfth switch 3534, and the eighth terminal 3558.

When the second antenna 1300 is connected to the load 5900, the resonance frequency of the second antenna 1300 may be changed. For another example, when the ninth switch 3531 is closed (not illustrated), the switching circuit 3500 may electrically connect the load 5900 to the first antenna 1200.

According to various embodiments of the present disclosure, the switching circuit 3500 may connect the load 5900 to an antenna, which is not connected to the communication circuit 1400, of the first antenna 1200 or the second antenna 1300. For example, as illustrated in FIG. 10, in the case where the first antenna 1200 and the communication circuit 1400 is connected to each other, the switching circuit 3500 may connect the second antenna 1300 to the load 5900. When communication is performed using the first antenna 1200, parasitic resonance may occur by the second antenna 1300 adjacent to the first antenna 1200. The parasitic resonance may affect the performance of the first antenna 1200. The switching circuit 3500 may change the resonance frequency of the second antenna 1300 by using the load 5900 so as to change the frequency band in which the parasitic resonance occurs, thereby preventing the deterioration of the performance of the first antenna 1200.

According to an embodiment, the switching circuit 3500 may be configured to selectively connect the ground part 3700 to the first antenna 1200 or the second antenna 1300. When the ground part 3700 is connected to the antenna, as in the case where the load 5900 is connected, the resonance frequency of the antenna may be changed. For example, the switching circuit 3500 may connect the ground part 3700 to an antenna, which is not connected to the communication circuit 1400, of the first antenna 1200 or the second antenna 1300.

According to an embodiment, the switching circuit 3500 may connect the load 5900 to an antenna, which is connected to the communication circuit 1400, of the first antenna 1200 or the second antenna 1300. For example, when the first switch 3511 and the ninth switch 3531 are closed, the switching circuit 3500 may electrically connect the first antenna 1200, the communication circuit 1400 and the load 5900 to each other. The resonance frequency of the first antenna 1200 may be changed depending on the state of the electronic device 5000. In this case, the resonance frequency of the first antenna 1200 may be compensated by connecting the first antenna 1200 to the load 5900. The impedance of the load 5900 connected to the first antenna 1200 may be changed depending on the resonance frequency of the first antenna 1200.

Figure 11:
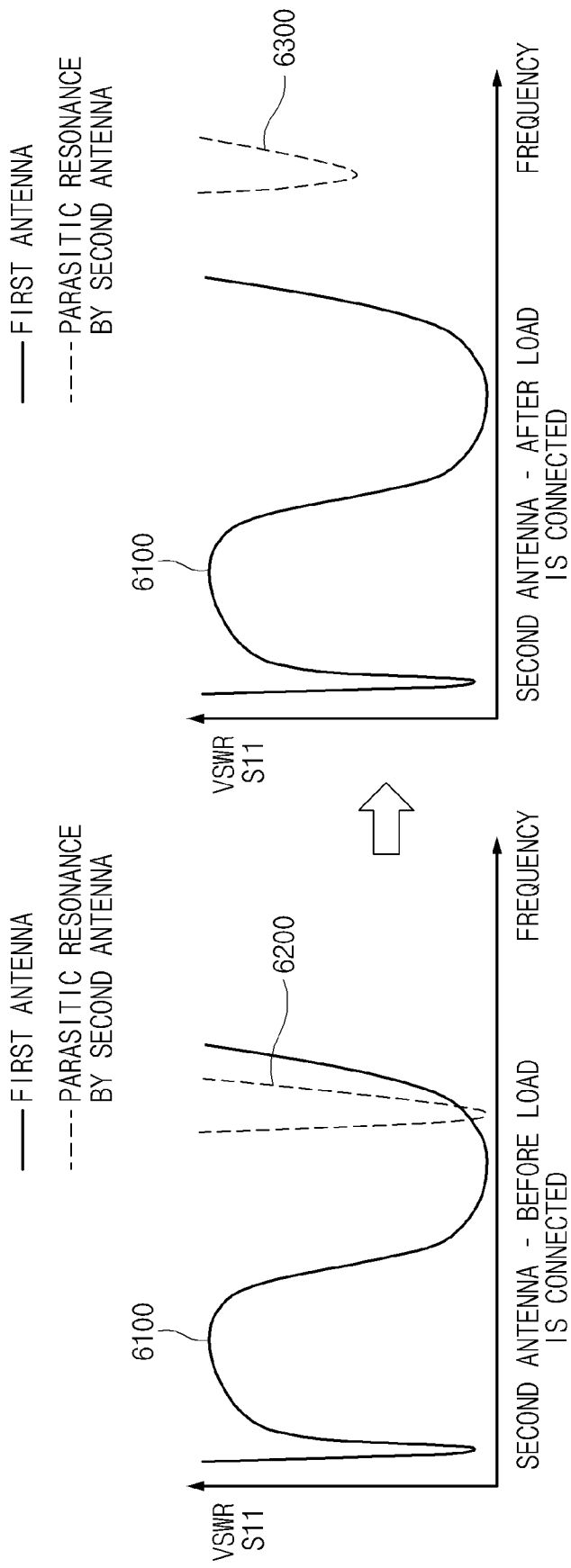
FIG. 11 illustrates a voltage standing wave ratio (VSWR) of an antenna according to a frequency of an electronic device, according to an embodiment.

FIG. 11 illustrates a voltage standing wave ratio (hereinafter referred to as "VSWR") of an antenna according to a frequency of an electronic device, according to an embodiment. The graph illustrated in FIG. 11 may be obtained from the electronic device 5000 illustrated in FIG. 10.

Referring to FIG. 11, a first graph 6100 represents the VSWR of a first antenna; a second graph 6200 represents the VSWR by the parasitic resonance when the load is not connected to the second antenna; and a third graph 6300 represents the VSWR by the parasitic resonance when the second antenna is connected to the load.

According to various embodiments of the present disclosure, in the case of performing communication using the first antenna, the parasitic resonance generated by the unused second antenna may affect the performance of the first antenna. As illustrated in the first graph 6100 and the second graph 6200, the radiation component of the first antenna may be coupled to the second antenna in a frequency band (e.g., a band in which VSWR of the first antenna is low) in which the first antenna performs communication, due to the parasitic resonance by the second antenna. In this case, the efficiency of the first antenna may be lowered. Accordingly, the electronic device may connect the second antenna to the load using a switching circuit for the purpose of preventing the efficiency degradation of the first antenna due to the parasitic resonance.

According to various embodiments of the present disclosure, when the load is connected to the second antenna, the resonance frequency of the second antenna may be changed. When the resonance frequency of the second antenna is changed, the frequency band in which the parasitic resonance by the second antenna is present may be changed. For example, when the resonance frequency of the second antenna increases, the frequency band in which the parasitic resonance by the second antenna occurs may increase. As illustrated in the first graph 6100 and the third graph 6300, the frequency band in which the parasitic resonance by the second antenna occurs may be higher than the frequency band in the case where the load is not connected to the second antenna. For example, the parasitic resonance by the second antenna may occur in a frequency band in which the first antenna does not perform communication. In this case, the parasitic resonance of the second antenna may not affect the efficiency of the first antenna.

Figure 12:
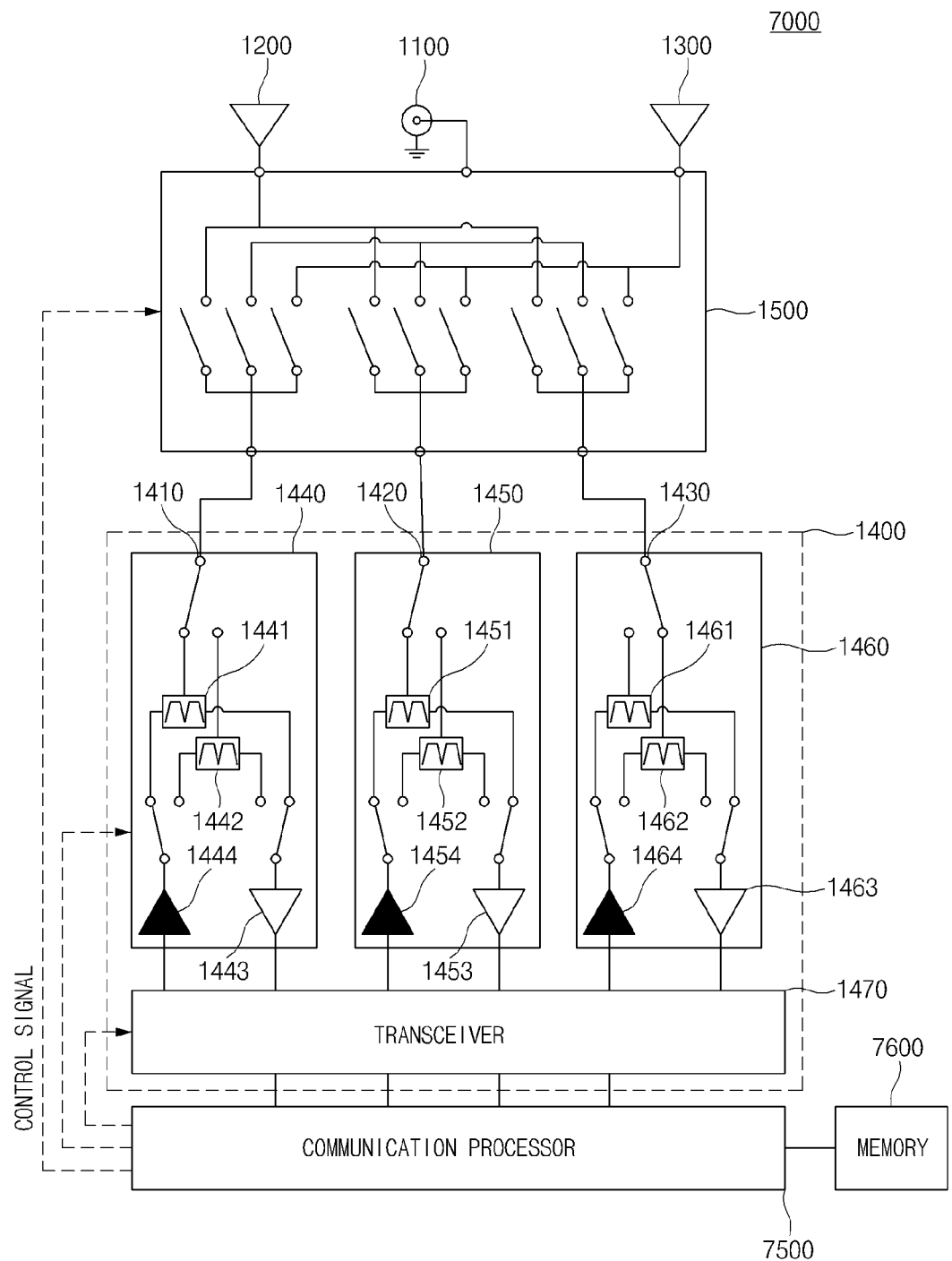
FIG. 12 illustrates a configuration of a communication circuit included in an electronic device, according to an embodiment.

FIG. 12 illustrates a configuration of a communication circuit included in an electronic device, according to an embodiment. For convenience of description, a description that is given with reference to FIG. 6 will not be repeated here.

Referring to FIG. 12, an electronic device 7000 (e.g., the electronic device 101, the electronic device 200, the electronic device 400, or the electronic device 8000) may include the test port 1100, the first antenna 1200, the second antenna 1300, the communication circuit 1400, the switching circuit 1500, a communication processor 7500, and a memory 7600. The communication circuit 1400 may include a first transmitter/receiver circuit 1440, a second transmitter/receiver circuit 1450, a third transmitter/receiver circuit 1460, and a transceiver 1470.

According to various embodiments of the present disclosure, the first transmitter/receiver circuit 1440 may include a first duplexer 1441, a second duplexer 1442, a low noise amplifier 1443 (hereinafter referred to as an "LNA"), and a power amplifier 1444. The first duplexer 1441 or the second duplexer 1442 may be selectively connected to the first port 1410 of the communication circuit 1400 through a switch. For example, the LNA 1443 may be selectively connected to the first duplexer 1441 or the second duplexer 1442 through the switch. The LNA 1443 may amplify an RF signal that is transmitted from the switching circuit 1500 through the first duplexer 1441 or the second duplexer 1442 and may transmit the amplified RF signal to the transceiver 1470. For example, the power amplifier 1444 may be selectively connected to the first duplexer 1441 or the second duplexer 1442 through the switch. The power amplifier 1444 may amplify the RF signal received from transceiver 1470 and may transmit the amplified RF signal to the switching circuit 1500 through the first duplexer 1441 or the second duplexer 1442. The first transmitter/receiver circuit 1440 may transmit or receive the signal of a first frequency band. The first frequency band may be, for example, about 600 MHz to about 1 GHz.

According to various embodiments of the present disclosure, the second transmitter/receiver circuit 1450 may include a first duplexer 1451, a second duplexer 1452, an LNA 1453, and a power amplifier 1454. The second transmitter/receiver circuit 1450 may transmit or receive the signal of a second frequency band. The second frequency band may be, for example, about 1.6 GHz to about 2.1 GHz.

According to various embodiments of the present disclosure, the third transmitter/receiver circuit 1460 may include a first duplexer 1461, a second duplexer 1462, an LNA 1463, and a power amplifier 1464. The third transmitter/receiver circuit 1460 may transmit or receive the signal of a third frequency band. The third frequency band may be, for example, about 1.8 GHz to about 2.7 GHz.

According to various embodiments of the present disclosure, the transceiver 1470 may be electrically connected to the first transmitter/receiver circuit 1440, the second transmitter/receiver circuit 1450, and the third transmitter/receiver circuit 1460. The transceiver 1470 may receive a signal from the LNA 1443, 1453, or 1463 of the first transmitter/receiver circuit 1440, the second transmitter/receiver circuit 1450, or the third transmitter/receiver circuit 1460. For the purpose of decreasing the frequency of the received signal, the transceiver 1470 may perform down-converting on the received signal. The transceiver 1470 may transmit the down-converted base band signal to the communication processor 7500.

According to various embodiments of the present disclosure, the transceiver 1470 may be electrically connected to the communication processor 7500. The transceiver 1470 may receive a signal from the communication processor 7500. For the purpose of increasing the frequency of the received signal, the transceiver 1470 may perform up-converting on the received base band signal. The transceiver 1470 may transmit the up-converted RF signal to the power amplifier 1444, 1454, or 1464 of the first transmitter/receiver circuit 1440, the second transmitter/receiver circuit 1450, of the third transmitter/receiver circuit 1460.

According to various embodiments of the present disclosure, the communication processor 7500 may be electrically connected to the transceiver 1470, the first transmitter/receiver circuit 1440, the second transmitter/receiver circuit 1450, the third transmitter/receiver circuit 1460, and the switching circuit 1500. The communication processor 7500 may transmit a control signal to the transceiver 1470, the first transmitter/receiver circuit 1440, the second transmitter/receiver circuit 1450, the third transmitter/receiver circuit 1460, and the switching circuit 1500. The communication processor 7500 may transmit a control signal so as to control the transceiver 1470, the first transmitter/receiver circuit 1440, the second transmitter/receiver circuit 1450, the third transmitter/receiver circuit 1460, and the switching circuit 1500. For example, the communication processor 7500 may generate the control signal by using General RF Control (GRFC), Mobile Industry Processor Interface (MIPI), or the like.

According to an embodiment, the communication processor 7500 may control the switching circuit 1500 such that one or more of the first port 1410 or the second port 1420 are connected to the test port 1100 during the manufacture of the electronic device 7000. The communication processor 7500 may control the switching circuit 1500 so as to connect one or more of the first port 1410, the second port 1420, or the third port 1430 to the test port 1100. According to an embodiment, the communication processor 7500 may control the switching circuit 1500 such that the test port 1100 is selectively connected to the first antenna 1200 or the second antenna 1300. According to an embodiment, the communication processor 7500 may control the switching circuit 1500 such that one or more of the first port 1410 or the second port 1420 are connected to one or more of the first antenna 1200 or the second antenna 1300 during operation of the electronic device 7000. The communication processor 7500 may control the switching circuit 1500 such that one or more of the first port 1410, the second port 1420, or the third port 1430 are selectively connected to one or more of the first antenna 1200 or the second antenna 1300. According to an embodiment, the communication processor 7500 may control the switching circuit 1500 such that the load is connected to an antenna, which is not connected to the communication circuit 1400, of the first antenna 1200 or the second antenna 1300. The communication processor 7500 may control the switching circuit 1500 such that the ground part is connected to an antenna, which is not connected to the communication circuit 1400, of the first antenna 1200 or the second antenna 1300.

According to an embodiment, the communication processor 7500 may connect the test port 1100 to one of the first port 1410, the second port 1420, the first antenna 1200, or the second antenna 1300. The communication processor 7500 may receive the control command generated based on the operation of the connected configuration, from a test device or an external device connected to the test device. When the control command is received, the communication processor 7500 may connect the test port 1100 to another of the first port 1410, the second port 1420, the first antenna 1200 or the second antenna 1300. The communication processor 7500 may receive an interrupt command generated based on the operation of the connected configuration, from a test device or an external device connected to the test device; when the interrupt command is received, the communication processor 7500 may interrupt the test. In detail, the above-mentioned operation will be described in FIG. 13.

According to various embodiments of the present disclosure, the memory 7600 may be electrically connected to the communication processor 7500. When executed, the memory 7600 may store an instruction that causes the communication processor 7500 to perform the above-mentioned operations.

According to an embodiment of the present disclosure, an electronic device may include a housing, a communication circuit positioned inside the housing, and including a first port for a first frequency band and a second port for a second frequency band, a first antenna positioned inside the housing or forming a part of the housing, a second antenna positioned inside the housing or forming a part of the housing, a test port positioned inside the housing or at least partially exposed through the housing, and a switching circuit configured to selectively connect one or more of the first port or the second port to one or more of the first antenna, the second antenna, or the test port.

According to another embodiment of the present disclosure, the electronic device may further include a processor electrically connected to the switching circuit and a memory electrically connected to the processor. The memory may store an instruction that, when executed, causes the processor to connect one or more of the first port or the second port to the test port during manufacturing.

According to still another embodiment of the present disclosure, the electronic device may further include a processor electrically connected to the switching circuit and a memory electrically connected to the processor. The memory may store an instruction that, when executed, causes the processor to connect selectively one or more of the first port or the second port to one or more of the first antenna or the second antenna during an operation of the electronic device.

According to yet another embodiment of the present disclosure, the communication circuit may further include a third port for a third frequency band, and the switching circuit may be configured to selectively connect each of the first port, the second port, or the third port to one of the first antenna, the second antenna, or the test port.

According to yet another embodiment of the present disclosure, the electronic device may further include a processor electrically connected to the switching circuit and a memory electrically connected to the processor. the memory may store an instruction that, when executed, causes the processor to connect one or more of the first port, the second port, or the third port to the test port during manufacturing.

According to yet another embodiment of the present disclosure, the electronic device may further include a processor electrically connected to the switching circuit and a memory electrically connected to the processor. the memory may store an instruction that, when executed, causes the processor to selectively connect one or more of the first port, the second port, or the third port to one or more of the first antenna or the second antenna during an operation of the electronic device.

According to yet another embodiment of the present disclosure, the third frequency band may be higher than the second frequency band, and the second frequency band may be higher than the first frequency band.

According to yet another embodiment of the present disclosure, the electronic device may further include a signal distribution unit that is electrically connected to two ports of the first port, the second port, and the third port and the switching circuit and selectively transmits one signal among signals received from each of the two ports, to the switching circuit.

According to yet another embodiment of the present disclosure, the electronic device may further include a load electrically connected to the switching circuit. The switching circuit may be configured to selectively connect the load to the first antenna or the second antenna.

According to yet another embodiment of the present disclosure, the electronic device may further include a processor electrically connected to the switching circuit and a memory electrically connected to the processor. The memory may store an instruction that, when executed, causes the processor to connect the load to an antenna, which is not connected to the communication circuit, among the first antenna or the second antenna.

According to yet another embodiment of the present disclosure, the electronic device may further include a ground part electrically connected to the switching circuit. The switching circuit may be configured to selectively connect the ground part to the first antenna or the second antenna.

According to yet another embodiment of the present disclosure, the electronic device may further include a processor electrically connected to the switching circuit and a memory electrically connected to the processor. The memory may store an instruction that, when executed, causes the processor to connect the ground part to an antenna, which is not connected to the communication circuit, among the first antenna or the second antenna.

According to yet another embodiment of the present disclosure, the switching circuit may be configured to selectively connect the test port to the first antenna or the second antenna.

According to yet another embodiment of the present disclosure, the switching circuit may include an opened terminal, and the switching circuit may be configured to connect the test port to the first antenna or the second antenna through a path extending from the opened terminal.

According to yet another embodiment of the present disclosure, the electronic device may further include a processor electrically connected to the switching circuit and a memory electrically connected to the processor. The test port may be electrically connected to a test device that tests the first port, the second port, the first antenna, or the second antenna, and the memory may store an instruction that, when executed, causes the processor to connect the test port to one of the first port, the second port, the first antenna, or the second antenna, to receive a control command generated based on an operation of one connected to the test port among the first port, the second port, the first antenna, or the second antenna, from the test device or an external device connected to the test device, and, when the control command is received, to perform the connection on another among the first port, the second port, the first antenna, or the second antenna.

According to yet another embodiment of the present disclosure, the memory may store an instruction that, when executed, causes the processor to receive an interrupt command generated based on the operation, from a test device or an external device connected to the test device and to interrupt the test for a first port, a second port, a first antenna, or a second antenna when the interrupt command is received.

The electronic device according to an embodiment of the present disclosure may include a communication circuit including a first antenna, a second antenna, a first circuit supporting the communication of a first frequency band, and a second circuit supporting the communication of a second frequency band, a test port connected to test equipment testing a first circuit, a second circuit, a first antenna, and a second antenna, and a plurality of switches. The electronic device may include a switching circuit connecting one of the first circuit, the second circuit, the first antenna, the second antenna, and the test port to another of the first circuit, the second circuit, the first antenna, the second antenna, and the test port.

According to another embodiment of the present disclosure, the communication circuit may further include a third circuit supporting the communication of a third frequency band. The switching circuit may be configured to connect one of the first circuit, the second circuit, the third circuit, the first antenna, the second antenna, and the test port to another of the first circuit, the second circuit, the third circuit, the first antenna, the second antenna, and the test port.

According to another embodiment of the present disclosure, the electronic device may further include a load electrically connected to the switching circuit. The switching circuit may be configured to selectively connect the load to the first antenna or the second antenna.

According to another embodiment of the present disclosure, the switching circuit may include an opened terminal. The switching circuit may be configured to connect the test port to the first antenna or the second antenna through a path extending from the opened terminal.

Figure 13:
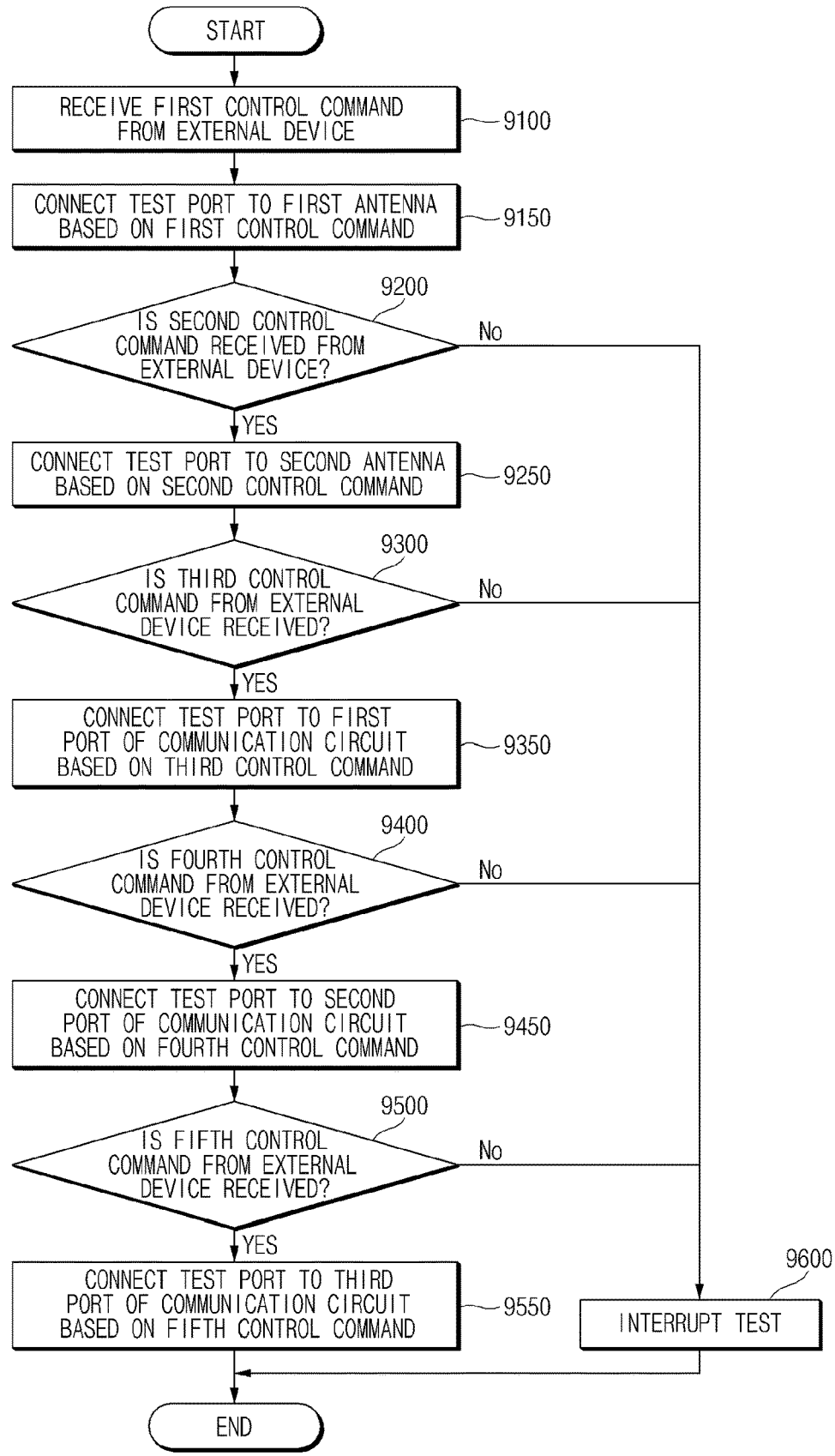
FIG. 13 is a flowchart for describing a method of testing a communication circuit and an antenna of an electronic device, according to an embodiment.

FIG. 13 is a flowchart for describing a method of testing a communication circuit and an antenna of an electronic device, according to an embodiment.

The flowchart illustrated in FIG. 13 may include operations that the electronic devices 1000 to 5000 illustrated in FIGS. 6 to 10 process. Even though omitted below, information about the electronic devices 1000 to 5000 described with reference to FIGS. 6 to 10 may be applied to the flowchart illustrated in FIG. 13.

According to various embodiments of the present disclosure, the electronic device may be connected to test equipment and a computing device and may test an antenna and a communication circuit. The test port of the electronic device may be connected to the test equipment that tests a module, for example, a first antenna, a second antenna, a first transmitter/receiver circuit connected to the first port, a second transmitter/receiver circuit connected to a second port, a third transmitter/receiver circuit connected to a third port, and the like, which are included in the electronic device. In addition, the electronic device may be connected to an external device capable of controlling the electronic device and the test equipment. For example, the electronic device may be connected to the external device through an interface, such as a USB port, short range communication, or the like or a test port.

Referring to FIG. 13, in operation 9100, the electronic device may receive a first control command from the external device. For example, the first control command may include an instruction that causes the electronic device to connect the test port to the first antenna.

In operation 9150, the electronic device may connect the test port to the first antenna based on the first control command. For example, the electronic device may verify that the first control command is an instruction for connecting the test port to the first antenna and may control a switching circuit. For another example, the electronic device may control a switching circuit depending on the first control command. The electronic device may control the on/off state of a plurality of switches included in the switching circuit. The electronic device may control a plurality of switches so as to connect the test port to the first antenna through a switching circuit.

According to various embodiments, the first antenna may receive an input signal from the test equipment through the test port. The response signal associated with the input signal may be transmitted from the first antenna to the test equipment through the test port. Information about the response signal transmitted to the test equipment may be transmitted to the external device that communicates with the test equipment. The external device may compare the information about the response signal with information pre-stored for test. The pre-stored information may be information associated with criteria for determining whether a module connected to the test equipment operates normally. In the case where the information about the response signal is within a normal range (e.g., in the case where the first antenna is normal operating) when being compared with the pre-stored information, the external device may transmit a control command (e.g., second control command) for proceeding with the test, to the electronic device. When the information about the response signal is a response signal that is out of the range defined by the pre-stored information (e.g., when the first antenna does not operate normally), the external device may not transmit a control command to the electronic device. The external device may transmit a message for providing a notification of the interruption of the test, to the electronic device or may transmit a command to shut down the electronic device. The control command may be transmitted from the test equipment to the electronic device.

In operation 9200, the electronic device may receive a second control command from the external device. In the case where the first antenna operates normally, the electronic device may receive the second control command from the external device. For example, the second control command may include an instruction that causes the electronic device to connect the test port to the second antenna. Upon receiving the second control command, the electronic device may perform operation 9200. In the case where the second control command has not been received during a specified time, the electronic device may perform operation 9600.

In the case where the second control command is received, at operation 9250, the electronic device may connect the test port to the second antenna based on the second control command. The electronic device may connect the test port to the second antenna by controlling the switching circuit depending on the second control command. When the test port is connected to the second antenna, the external device may determine whether the second antenna operates normally, by controlling the test equipment connected to the test port.

In operation 9300, the electronic device may receive a third control command from the external device. In the case where the second antenna operates normally, the electronic device may receive the third control command from the external device. The third control command may include, for example, a command that causes the electronic device to connect the test port to the first port of the communication circuit. Upon receiving the third control command, the electronic device may perform operation 9350. In the case where the third control command has not been received during a specified time, the electronic device may perform operation 9600.

When the control command is received, in operation 9350, the electronic device may connect the test port to the first port of the communication circuit based on the third control command. The electronic device may connect the test port to the first port of the communication circuit by controlling the switching circuit depending on the third control command. When the test port is connected to the first port of the communication circuit, the external device may determine whether the circuit (e.g., first transmitter/receiver circuit) connected to the first port of the communication circuit operates normally, by controlling the test equipment connected to the test port.

In operation 9400, the electronic device may receive a fourth control command from the external device. In the case where the circuit connected to the first port of the communication circuit operates normally, the electronic device may receive the fourth control command from the external device. The fourth control command may include, for example, a command that causes the electronic device to connect the test port to the second port of the communication circuit. Upon receiving the fourth control command, the electronic device may perform operation 9450. In the case where the fourth control command has not been received during a specified time, the electronic device may perform operation 9600.

When the control command is received, in operation 9450, the electronic device may connect the test port to the second port of the communication circuit based on the fourth control command. The electronic device may connect the test port to the second port of the communication circuit by controlling the switching circuit depending on the fourth control command. When the test port is connected to the second port of the communication circuit, the external device may determine whether the circuit (e.g., second transmitter/receiver circuit) connected to the second port of the communication circuit operates normally, by controlling the test equipment connected to the test port.

In operation 9500, the electronic device may receive a fifth control command from the external device. In the case where the circuit connected to the second port of the communication circuit operates normally, the electronic device may receive the fifth control command from the external device. The fifth control command may include, for example, a command that causes the electronic device to connect the test port to the third port of the communication circuit. Upon receiving the fifth control command, the electronic device may perform operation 9550. In the case where the fifth control command has not been received during a specified time, the electronic device may perform operation 9600.

When the control command is received, in operation 9550, the electronic device may connect the test port to the third port of the communication circuit based on the fourth control command. The electronic device may connect the test port to the third port of the communication circuit by controlling the switching circuit depending on the fifth control command. When the test port is connected to the third port of the communication circuit, the external device may determine whether the circuit (e.g., third transmitter/receiver circuit) connected to the third port of the communication circuit operates normally, by controlling the test equipment connected to the test port.

In the case where the control command is not received, in operation 9600, the electronic device may interrupt the test. When one of the modules such as the first antenna, the second antenna, the first transmitter/receiver circuit connected to the first port, the second transmitter/receiver circuit connected to the second port, and the third transmitter/receiver circuit connected to the third port does not operate normally, the electronic device may interrupt the test. For example, in the case where a progress command has not been received during the specified time, the electronic device may interrupt the test. The electronic device may display a message, which is received from the external device, for providing a notification of the interruption of the test, or may cut off the power depending on a command to shut down the electronic device.

The above-described operations may be performed in various orders. For example, the electronic device may repeat the following operation: an operation of connecting the test port to any of the first port, the second port, the first antenna, or the second antenna depending on a control command; an operation of receiving the control command from the external device when the connected module passes the test; and an operation of connecting the test port to any other untested module among the first port, the second port, the first antenna, or the second antenna when the control command is received.

A module or a program module according to various embodiments may include at least one of the above elements, or a part of the above elements may be omitted, or additional other elements may be further included. Operations performed by a module, a program module, or other elements according to various embodiments may be executed sequentially, in parallel, repeatedly, or in a heuristic method. According to another embodiment, some operations may be executed in different sequences or may be omitted. Alternatively, other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

The invention claimed is:

1. An electronic device comprising:
   a housing;
   a communication circuit positioned inside the housing and including a first port for a first frequency band and a second port for a second frequency band;
   a first antenna positioned inside the housing or forming a part of the housing;
   a second antenna positioned inside the housing or forming a part of the housing;
   a test port positioned inside the housing or at least partially exposed through the housing; and
   a switching circuit configured to:
      vary a connection between the first port and the first antenna, the second antenna, and the test port, and
      vary a connection between the second port and the first antenna, the second antenna, and the test port,
   wherein switching circuit varies the connections by selectively connecting one or more of the first port or the second port to one or more of the first antenna, the second antenna, or the test port,
   wherein the switching circuit includes an opened terminal and the switching circuit is configured to connect the test port to the first antenna or the second antenna through a path extending from the opened terminal.

2. The electronic device of claim 1, further comprising:
   a processor electrically connected to the switching circuit; and
   a memory electrically connected to the processor,
   wherein the memory stores an instruction that, when executed, causes the processor to connect one or more of the first port or the second port to the test port during manufacturing.

3. The electronic device of claim 1, further comprising:
   a processor electrically connected to the switching circuit; and
   a memory electrically connected to the processor,
   wherein the memory stores an instruction that, when executed, causes the processor to connect selectively one or more of the first port or the second port to one or more of the first antenna or the second antenna during an operation of the electronic device.

4. The electronic device of claim 1, wherein:
   the communication circuit further includes a third port for a third frequency band, and
   the switching circuit is configured to selectively connect each of the first port, the second port, or the third port individually to one of the first antenna, the second antenna, or the test port.

5. The electronic device of claim 4, further comprising:
   a processor electrically connected to the switching circuit; and
   a memory electrically connected to the processor,
   wherein the memory stores an instruction that, when executed, causes the processor to connect one or more of the first port, the second port, or the third port to the test port during manufacturing.

6. The electronic device of claim 4, further comprising:
   a processor electrically connected to the switching circuit; and
   a memory electrically connected to the processor,
   wherein the memory stores an instruction that, when executed, causes the processor to selectively connect one or more of the first port, the second port, or the third port to one or more of the first antenna or the second antenna during an operation of the electronic device.

7. The electronic device of claim 4, wherein:
   the third frequency band is higher than the second frequency band, and
   the second frequency band is higher than the first frequency band.

8. The electronic device of claim 4, further comprising a signal distribution unit that is electrically connected to two ports of the first port, the second port, and the third port and the switching circuit, and is configured to selectively transmit one signal among signals received from each of the two ports to the switching circuit.

9. The electronic device of claim 1, further comprising:
   a load electrically connected to the switching circuit,
   wherein the switching circuit is configured to selectively connect the load to the first antenna or the second antenna.

10. The electronic device of claim 9, further comprising:
    a processor electrically connected to the switching circuit; and
    a memory electrically connected to the processor,
    wherein the memory stores an instruction that, when executed, causes the processor to connect the load to an antenna, which is disconnected to the communication circuit, among the first antenna or the second antenna.

11. The electronic device of claim 1, further comprising:
    a ground part electrically connected to the switching circuit,
    wherein the switching circuit is configured to selectively connect the ground part to the first antenna or the second antenna.

12. The electronic device of claim 11, further comprising:
    a processor electrically connected to the switching circuit; and
    a memory electrically connected to the processor,
    wherein the memory stores an instruction that, when executed, causes the processor to connect the ground part to an antenna, which is disconnected to the communication circuit, among the first antenna or the second antenna.

13. The electronic device of claim 1, wherein the switching circuit is configured to selectively connect the test port to the first antenna or the second antenna.

14. The electronic device of claim 13, further comprising:
    a processor electrically connected to the switching circuit; and
    a memory electrically connected to the processor,
    wherein:
       the test port is electrically connected to a test device that tests the first port, the second port, the first antenna, or the second antenna, and
       the memory stores an instruction that, when executed, causes the processor to:
          connect the test port to one of the first port, the second port, the first antenna, or the second antenna;
          receive a control command generated based on an operation of one connected to the test port among the first port, the second port, the first antenna, or the second antenna, from the test device or an external device connected to the test device; and
          when the control command is received, perform the connection on another among the first port, the second port, the first antenna, or the second antenna.

15. An electronic device comprising:
a housing comprising a conductive material;
a communication circuit positioned inside the housing and including a first port for a first frequency band and a second port for a second frequency band;
a first antenna positioned inside the housing or forming a part of the housing;
a second antenna positioned inside the housing or forming a part of the housing;
a test port positioned inside the housing or at least partially exposed through the housing; and
a switching circuit configured to removably couple one or more of the first port or the second port to each of the first antenna, the second antenna, or the test port,
wherein at least one of the first antenna or the second antenna forms a part of the housing,
wherein the switching circuit includes an opened terminal and the switching circuit is configured to connect the test port to the first antenna or the second antenna through a path extending from the opened terminal.

16. The electronic device of claim 15, further comprising:
a processor electrically connected to the switching circuit; and
a memory electrically connected to the processor,
wherein the memory stores an instruction that, when executed, causes the processor to connect one or more of the first port or the second port to the test port during manufacturing.

17. The electronic device of claim 15, further comprising:
a processor electrically connected to the switching circuit; and
a memory electrically connected to the processor,
wherein the memory stores an instruction that, when executed, causes the processor to connect selectively one or more of the first port or the second port to one or more of the first antenna or the second antenna during an operation of the electronic device.

18. The electronic device of claim 15, wherein:
the communication circuit further includes a third port for a third frequency band, and
the switching circuit is configured to selectively connect each of the first port, the second port, or the third port individually to one of the first antenna, the second antenna, or the test port.

19. The electronic device of claim 18, further comprising:
a processor electrically connected to the switching circuit; and
a memory electrically connected to the processor,
wherein the memory stores an instruction that, when executed, causes the processor to connect one or more of the first port, the second port, or the third port to the test port during manufacturing.

* * * * *